US007022590B2

(12) United States Patent
Yamazaki et al.

(10) Patent No.: US 7,022,590 B2
(45) Date of Patent: Apr. 4, 2006

(54) METHOD FOR FORMING A SEMICONDUCTOR DEVICE USING CRYSTALS OF CRYSTAL GROWTH

(75) Inventors: Shunpei Yamazaki, Setagaya (JP); Akiharu Miyanaga, Hadano (JP); Toru Mitsuki, Tochigi (JP); Hisashi Ohtani, Tochigi (JP)

(73) Assignee: Semiconductor Energy Laboratory Co., Ltd, Kanagawa-ken (JP)

( * ) Notice: Subject to any disclaimer, the term of this patent is extended or adjusted under 35 U.S.C. 154(b) by 245 days.

(21) Appl. No.: 10/739,045

(22) Filed: Dec. 19, 2003

(65) Prior Publication Data

US 2004/0132233 A1 Jul. 8, 2004

Related U.S. Application Data

(62) Division of application No. 10/263,730, filed on Oct. 4, 2002, now Pat. No. 6,720,575, which is a division of application No. 09/596,011, filed on Jun. 16, 2000, now Pat. No. 6,515,299, which is a division of application No. 09/139,656, filed on Aug. 25, 1998, now Pat. No. 6,107,639.

(30) Foreign Application Priority Data

| | | |
|---|---|---|
| Aug. 26, 1997 | (JP) | 9-246065 |
| Apr. 9, 1998 | (JP) | 10-114270 |
| May 20, 1998 | (JP) | 10-156697 |

(51) Int. Cl.
*H01L 21/02* (2006.01)

(52) U.S. Cl. .................................... 438/479; 438/486

(58) Field of Classification Search ................ 438/479, 438/486

See application file for complete search history.

(56) References Cited

U.S. PATENT DOCUMENTS

| | | | | |
|---|---|---|---|---|
| 4,773,964 | A * | 9/1988 | Haond | 117/45 |
| 5,221,365 | A | 6/1993 | Noguchi et al. | |
| 5,403,772 | A | 4/1995 | Zhang et al. | |
| 5,563,426 | A | 10/1996 | Zhang et al. | |
| 5,604,360 | A | 2/1997 | Zhang et al. | |
| 5,619,054 | A | 4/1997 | Hishimoto | |
| 5,643,826 | A | 7/1997 | Ohtani et al. | |
| 5,648,277 | A | 7/1997 | Zhang et al. | |
| 5,882,960 | A | 3/1999 | Zhang et al. | |

(Continued)

FOREIGN PATENT DOCUMENTS

| | | |
|---|---|---|
| JP | 07-045519 | 2/1995 |

(Continued)

*Primary Examiner*—Evan Pert
(74) *Attorney, Agent, or Firm*—Eric J. Robinson; Robinson Intellectual Property Law Office, P.C.

(57) ABSTRACT

An insulating film 103 for making an under insulating layer 104 is formed on a quartz or semiconductor substrate 100. Recesses 105*a* to 105*d* corresponding to recesses 101*a* to 101*d* of the substrate 100 are formed on the surface of the insulating film 103. The surface of this insulating film 103 is flattened to form the under insulating layer 104. By this flattening process, the distance L1, L2, . . . , Ln between the recesses 106*a*, 106*b*, 106*d* of the under insulating layer 104 is made 0.3 μm or more, and the depth of the respective recesses is made 10 nm or less. The root-mean-square surface roughness of the surface of the under insulating film 104 is made 0.3 nm or less. By this, in the recesses 106*a*, 106*b*, 106*d*, it can be avoided to block crystal growth of the semiconductor thin film, and crystal grain boundaries can be substantially disappeared.

21 Claims, 22 Drawing Sheets

U.S. PATENT DOCUMENTS

| | | | | |
|---|---|---|---|---|
| 5,888,857 | A | 3/1999 | Zhang et al. | |
| 5,895,933 | A | 4/1999 | Zhang et al. | |
| 5,923,962 | A | 7/1999 | Ohtani et al. | |
| 5,942,768 | A | 8/1999 | Zhang | |
| 6,294,815 | B1 | 9/2001 | Yamazaki | |
| 6,335,542 | B1 * | 1/2002 | Miyasaka | 257/66 |
| 6,107,639 | A1 | 6/2002 | Jean et al. | |

FOREIGN PATENT DOCUMENTS

| | | |
|---|---|---|
| JP | 07-130652 | 5/1995 |
| JP | 07-135318 | 5/1995 |
| JP | 07-321339 | 12/1995 |
| JP | 08-078329 | 3/1996 |
| JP | 08-213634 | 8/1996 |

* cited by examiner

FORMATION OF AMORPHOUS SILICON FILM

THERMAL OXIDATION STEP

FLATTENING STEP

FLATTENING STEP

STEP OF ADDING PHOSPHORUS

GETTERING STEP

METHOD FOR FORMING A SEMICONDUCTOR DEVICE USING CRYSTALS OF CRYSTAL GROWTH

BACKGROUND OF THE INVENTION

1. Field of the Invention

The present invention relates to a semiconductor thin film formed on a substrate having an insulating surface and a semiconductor device using the thin film as an active layer. Particularly, a thin film obtained by crystallizing an amorphous semiconductor thin film including silicon as the main ingredient is used as the semiconductor thin film.

Moreover, the present invention relates to a structure of a semiconductor circuit and an electrooptical device constituted by semiconductor devices such as thin film transistors, and an electronic equipment provided with them.

In the present specification, it is assumed that all of the foregoing thin film transistor, semiconductor circuit, electrooptical device, and electronic equipment are included in the category of "semiconductor device". That is, any device which can function by using semiconductor characteristics will be referred to as a semiconductor device. Thus, the semiconductor device claimed in the present application includes not only a single component such as a thin film transistor but also a semiconductor circuit and an electrooptical device made of integration of such single components, and an electronic equipment provided with those as parts.

2. Description of the Related Art

In recent years, attention has been paid to a technique for constituting a thin film transistor (TFT) using a semiconductor thin film (with a thickness of about several tens to several hundreds nm) formed on a substrate having an insulating surface. Development of the thin film transistor especially as a switching element for a picture display device (for example, liquid crystal display device) has been hastened.

For example, in the liquid crystal display device, tests have been made to application of TFTs to any electric circuit, such as a pixel matrix circuit for individually controlling pixel regions arranged in matrix, a driving circuit for controlling the pixel matrix circuit, and a logic circuit (arithmetic circuit, memory circuit, clock generator, etc.) for processing data signals from the outside.

In the present circumstances, although a TFT using a noncrystalline silicon film (amorphous silicon film) has been put into practical use, a TFT using a crystalline silicon film (polysilicon film, etc.) is necessary for an electric circuit requiring performance of further high speed operation, such as a driving circuit and a logic circuit.

For example, as a method of forming a crystalline silicon film on a glass substrate, there is well known a technique disclosed in Japanese Patent Unexamined Publication No. Hei. 7-130652 and No. Hei. 8-78329 by the present applicant. According to the technique disclosed in these publications, a catalytic element for promoting crystallization of an amorphous silicon film is used to enable the formation of a crystalline silicon film with excellent crystallinity by a heat treatment at about 500 to 600° C. for 4 hours.

Especially, there is also known a technique for obtaining a silicon film having a crystal structure preferable for a device component by nonselectively introducing a catalytic element to control the direction of crystal growth (for example, Japanese Patent Unexamined Publication No. Hei. 7-45519 and No. Hei. 8-213634). This technique is called a lateral growth method. According to the lateral growth method, crystal grain boundaries exist parallel to the growth direction, and when the direction of current of a component is made parallel to the growth direction, the effect of the grain boundaries can be lowered to the lower most limit. As a result, in spite of polycrystal, characteristics comparable to a single crystal material can be also obtained.

The lateral growth method will be described in brief. In the lateral growth method, a mask film of silicon oxide or the like is formed on an amorphous silicon film, and a window is selectively formed therein. A catalytic element is introduced through the window by various methods such as a sputtering method, a vapor phase growth method, and a coating method.

Then heat crystallization is carried out so that crystal growth progresses from an introduced portion of the catalytic element as a starting point. This is because the catalytic element crystallizes the amorphous silicon film while diffusing into the silicon film. In general, as a temperature is high and a time is long, crystallization progresses to a further point. The details are disclosed in the foregoing patent publications.

The present inventors have repeated various trials and errors to improve crystallinity of a crystalline silicon film (called polysilicon film) having crystal grain boundaries. The primary object is to make the crystal grain boundary substantially harmless. That is, the object is to substantially get rid of the crystal grain boundary so that the movement of a carrier (electron or hole) can be made smooth.

The common concept of a semiconductor film disclosed in the foregoing publications is to make crystal grain boundaries substantially harmless. That is, the primary object was to substantially get rid of the crystal grain boundaries so that the movement of a carrier (electron or hole) is made smooth.

Ideally, if higher and longer annealing is carried out, unlimitedly large lateral growth ought to be obtained. However, even by a semiconductor film disclosed in the foregoing publications, it was observed that although the lateral growth region was enlarged, the quality of crystal was totally lowered. It can be said that the crystal quality is insufficient for high speed operation required by a logic circuit. That is, in order to realize a system-on-panel having a built-in logic circuit, the development of a quite novel material, which has not conventionally existed, is desired.

According to the present technique, in the lateral growth method using nickel as a catalytic element, although the maximum width of lateral growth without crystal disturbance is 50 to 60 μm, it is necessary to further increase the lateral growth region to enlarge a component.

In crystallization by conventional annealing, it has been considered that as the asperities of an under film of a semiconductor thin film are large, the occurrence of crystal nuclei becomes easy and a crystal growth time becomes short. It is conceivable that this is because the asperity portions function as nuclei of crystallization. However, the present inventors found that from various experimental results, in the lateral growth method, since the asperities of an under film reduce the quality of crystal and reduce the speed of lateral growth, it is preferable that the asperities are as few as possible.

The feature of the lateral growth method is that it is possible to obtain a semiconductor thin film having crystallinity almost equal to single crystal by causing only the added catalytic elements to be crystal growth nuclei. However, the asperities of the under film are apt to become crystal growth nuclei, and this crystal growth disturbs the crystallinity of the lateral growth region and further blocks the lateral growth. Moreover, the asperities generate distortion or the like in the crystal grain, and causes a shift of the line in a crystal axis, or the like. Besides, since the asperities of the under film of the semiconductor thin film is irregular, there is a fear that crystallinity is different for each place or each substrate.

In general, a quartz substrate is used as a liquid crystal panel, and the asperities of the quartz substrate were observed by an AFM (Atomic Force Microscope). FIGS. 20A and 20B show AFM photographs. FIG. 20A shows a quartz substrate generally used for a liquid crystal panel, which is called sample A in this specification. FIG. 20B shows a quartz substrate with higher quality than sample A, which is called sample B in this specification. The respective observed regions are $10 \times 10\ \mu m^2$.

In sample A, although the root-mean-square surface roughness Rms is about 1 to 1.5 nm, the ten-point-mean roughness Rz is about 10 to 30 nm, and the maximum vertical difference P–V in the observed region is 20 to 50 nm. Such vertical difference was observed as a recess caved at a sharp angle in a section curve by the AFM of the roughness of sample A. In the photograph shown in FIG. 20A, the recess is confirmed as a black point. The root-mean-square surface roughness Rms is the root of a mean value of a square of a deviation from a reference surface to a specified surface.

On the other hand, in the observation photograph of sample B with high quality shown in FIG. 20B, there is no black point such as in FIG. 20A. With respect to the sample B with high quality, the root-mean-square surface roughness Rms is about 0.4 to 0.6 nm, the ten-point-mean roughness Rz is about 2 to 4 nm, and the maximum vertical difference P–V in the observed region is 4 to 9 nm. As indicated by these values, the depth of a recess of sample B is in an order of several nm, and it is understood that sample B has a very flat surface as compared with sample A.

For example, in the case where a liquid crystal panel is manufactured, as shown in FIG. 19A, an amorphous silicon film 3 is formed on a quartz substrate 1 having a recess 2 with a depth 1 to ½ time of the thickness of an active layer as in sample A and is crystallized. However, as shown in FIG. 19B, since the depth of the recess 2 is almost 1 to ½ time of the thickness of the amorphous silicon film 3, a recess 5 reflecting the shape of the recess 2 is also formed on the surface of the amorphous silicon film 3. When such an amorphous silicon film is crystallized, the crystal axis is disturbed by this recess 5, so that it is difficult to obtain a film having crystallinity comparable to single crystal. Incidentally, FIG. 19B is an enlarged view showing a vicinity 4 of the recess 2.

Moreover, as shown in FIG. 20A, since the recesses 2 on the surface of the quartz substrate 1 are irregularly present, the crystallinity of the crystalline semiconductor thin film is irregularly disturbed. As a result, characteristics of individual semiconductor components, such as TFTs, on the same substrate become irregular, so that the reliability is damaged.

Thus, even if a driving circuit is constituted by such a semiconductor thin film, required performance can not be still completely satisfied. Especially, in the present circumstances, it is impossible to constitute a high speed logic circuit requiring very high speed operation of from megahertz to gigahertz by conventional TFTs.

The problem due to such a recess can be eliminated if a quartz substrate with high quality, such as sample B shown in FIG. 20B, is used. However, since the substrate becomes expensive, cost performance becomes low.

SUMMARY OF THE INVENTION

An object of the present invention is to enable formation of a semiconductor thin film with crystallinity which can be regarded as substantially single crystal even if a low grade substrate as shown in FIG. 20A is used.

That is, an object of the present invention is to solve the foregoing problem and to obtain a high performance semiconductor device such as a high speed logic circuit which can not be manufactured by a conventional TFT, by smoothing and leveling the surface of a substrate on which a semiconductor thin film is formed or the surface of an under film formed on the substrate, to form a semiconductor thin film having crystallinity, which can be substantially regarded as single crystal, on the surface.

Another object of the present invention is to provide a high performance semiconductor device at low a low price by enabling the formation of a semiconductor thin film having crystallinity which can be substantially regarded as single crystal even if a low grade substrate such as sample A shown in FIG. 20A is used.

In order to achieve the above objects, according to the present invention, in a semiconductor device using a semiconductor thin film made of a collective of a plurality of rod-like or flattened rod-like crystals containing silicon as the main ingredient, it is characterized in that the surface of an insulator as an under film of the semiconductor thin film has recesses, and the distance between adjacent ones of the recesses is not smaller than three times as long as the short side of the rod-like or flattened rod-like crystals.

According to another aspect of the present invention, in the foregoing semiconductor device, the distance L between adjacent ones of the recesses is not smaller than 0.3 μm.

DETAILED DESCRIPTION OF THE INVENTION

First, the gist of the present invention will be described with reference to FIGS. 1A and 1B.

Figure 1A:
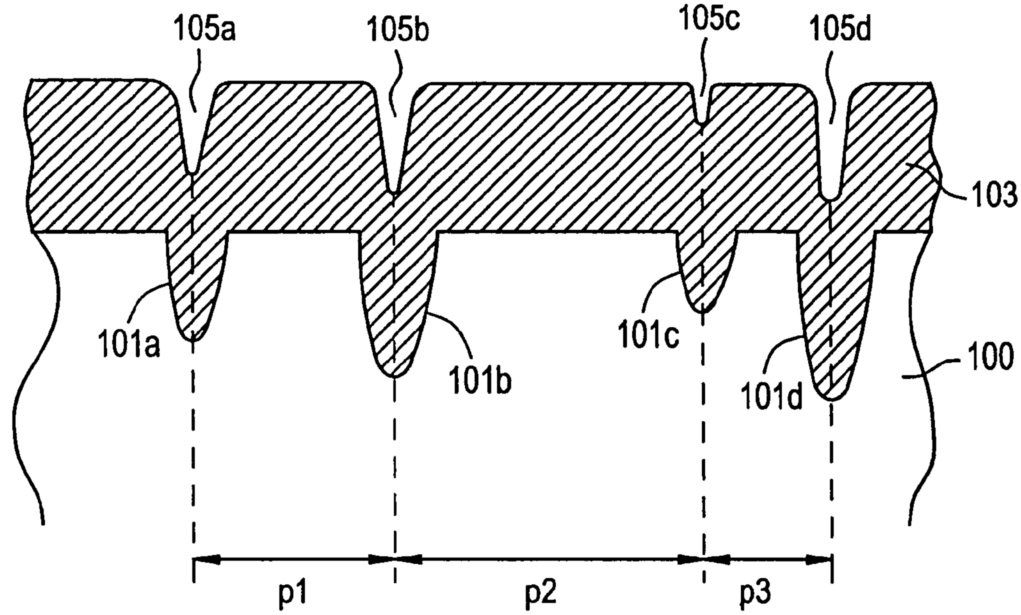
FIGS. 1A and 1B are views showing manufacturing steps of an under film of an embodiment.
Figure 1B:
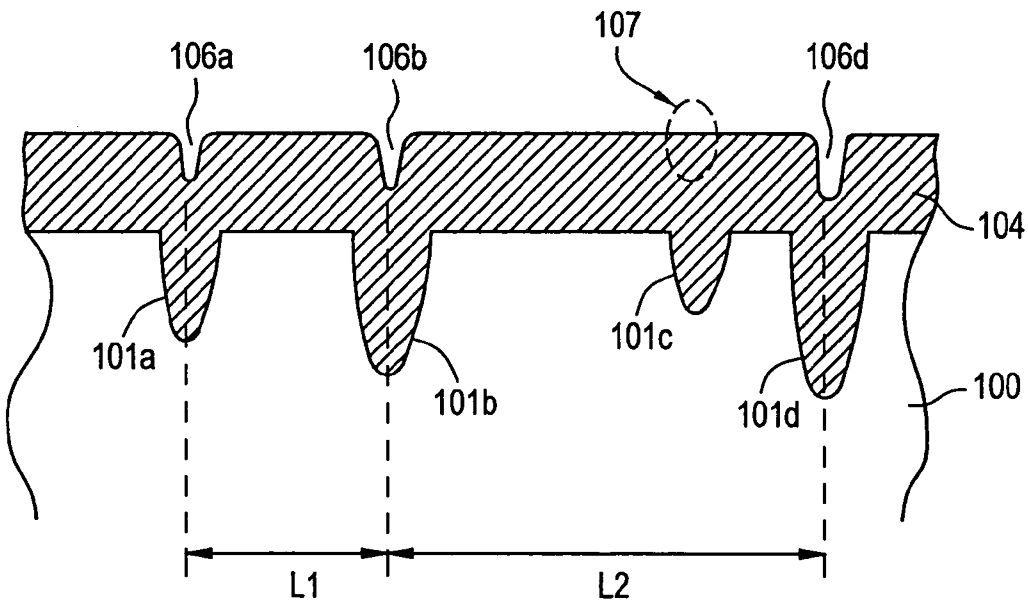

FIGS. 1A and 1B are sectional views showing an under insulating layer of the present invention, and a semiconductor thin film made of a collective of a plurality of rod-like or flattened rod-like crystals containing silicon as the main ingredient is formed on the under insulating layer.

As shown in FIG. 1A, an insulating film 103 making the under insulating layer is formed on a quartz or a semiconductor substrate 100. Recesses 105*a* to 105*d* corresponding to recesses 101*a* to 101*d* of the substrate 100 are formed on the surface of the insulating film 103.

Figure 2:
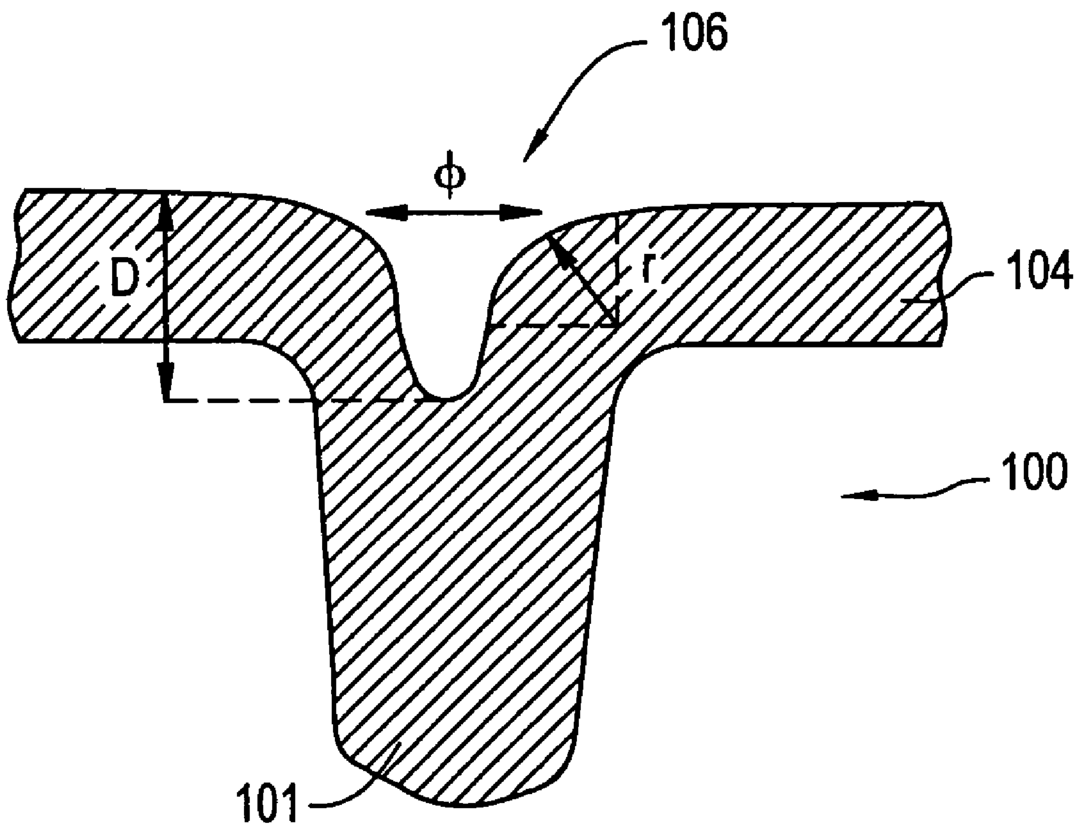
FIG. 2 is an enlarged view of a recess of the under film of embodiment 1.

Next, as shown in FIG. 1B, the surface of the insulating film 103 is flattened to form an under insulating layer 104. In this flattening step, the recess 105*c* is flattened as indicated by 107 to decrease the number of recesses 106, so that the distance L1, L2, . . . Ln between adjacent recesses 106 is made 0.3 μm or more, preferably 0.5 μm or more. Incidentally, FIG. 2 is an enlarged view showing the vicinity of the recess 106.

The semiconductor thin film of the present invention is one obtained by crystallizing an amorphous semiconductor thin film. As shown in FIG. 8B, the semiconductor thin film is a collective of a plurality of rod-like or flattened rod-like crystal grains 251 to 253 containing silicon as the main ingredient. This rod-like or flattened rod-like crystal grain is crystallized to grow in the <111> direction. This crystal growth distance (length of a long side) is several tens μm, and on the other hand, the width w in a short side direction is about 0.1 μm.

In the present invention, by forming the under insulating layer 104 in which the distance L between the adjacent recesses 106 is made not smaller than three times as long as the width w of the short side, that is, 0.3 μm or more, it is contrived such that the crystal growth of the semiconductor thin film is not blocked. The distance L between adjacent recesses 106 is more preferably made not smaller than 5 times as long as the width w of the short side, that is, 0.5 μm or more. It is indicated that as the distance L becomes long, the degree of flatness on the surface of the insulating layer 104 becomes high. According to the design rule of a present submicron device, the channel length is about 0.35 μm, and when the distance L is made 0.3 μm or more, it becomes possible to form one channel formation region in an almost flat surface.

It is appropriate that the distance L between the recesses 106 is more preferably made long up to the degree of a lateral growth distance corresponding to the length of the long side in the lateral growth direction, not only in the short side direction. The distance L can be made 10 μm or more, further, 100 μm by the flattening step.

Further, as shown in FIG. 1B, the number of recesses 106 is reduced by the flattening step, so that the number (density) per unit area of the recesses 106 can be made 100 pieces/$cm^2$ or less. In the present invention, in order not to prevent the lateral growth, since the lateral growth distance is about 100 μm, if the number per unit area is not larger than $1 \div (100 \times 100\ \mu m^2) = 10000$ pieces/$cm^2$, it is conceivable that the influence of the recesses 106 of the insulating layer 104 on the lateral growth becomes smaller than natural crystallization.

Figure 20A:
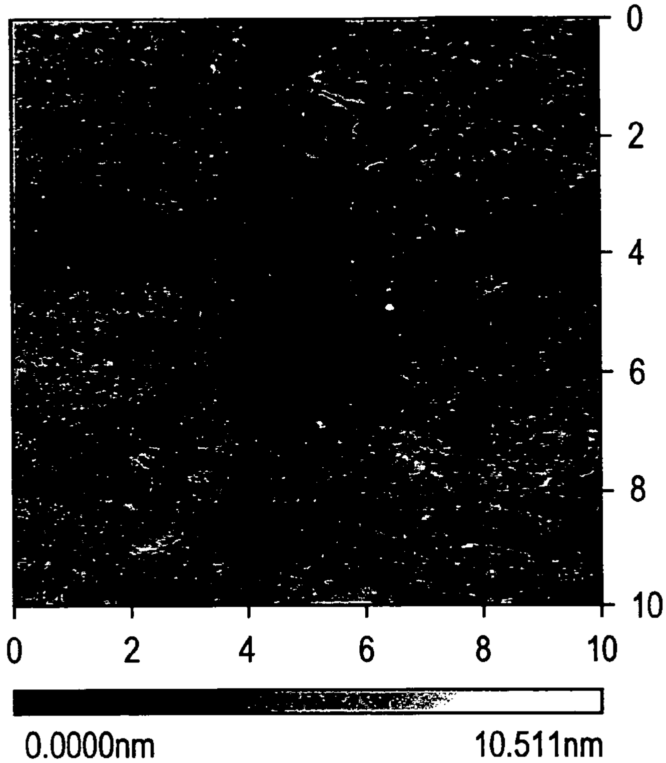
FIGS. 20A and 20B are atomic force microscope (AMF) photographs of quartz substrate surfaces.
Figure 20B:
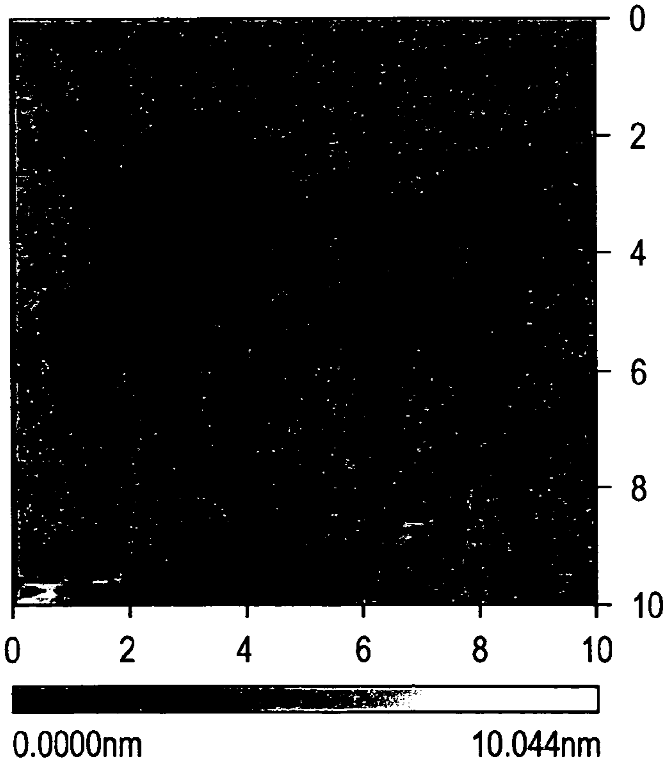

Incidentally, the foregoing distance D and the density of the recesses may be measured by regarding the places of black points in an AFM photograph as recesses, as shown in FIGS. 20A and 20B.

However, even if the distance L between the recesses 106 becomes long and the number thereof is made small, if the recesses 106 are deep, the covering property of the semiconductor thin film at the recess is damaged and the lateral growth is interrupted by the recess 106. In order to solve such a problem, the depth D of the recesses 106 of the insulating layer 104 is made shallower than the thickness of the semiconductor thin film by the flattening step. Since the active layer of a TFT has a thickness of about 10 to several hundreds nm, the depth D is made thinner than the active layer, that is, 10 nm or less, preferably 5 nm or less, more preferably 3 nm or less. Moreover, the root-mean-square surface roughness Rms of the insulating layer 104 is made 0.3 nm or less, within the range of 0.3 to 0.2 nm by the flattening step. More preferably, the roughness Rms is made 0.15 nm or less. These values are measured by the AFM.

In this embodiment, when a mean value of the distances L between adjacent recesses 106 is La, and a mean value of the depths D of the recesses 106 is Da, Da/La is used as other index of smoothness and flatness. Even if the distance L between the recesses is long, if the recess 105 is deep, a recess is formed on the surface of the semiconductor thin film formed on the insulating layer 104. Then the mean value Da is made smaller than the mean value La. That is, the insulating layer 104 with such a smooth surface that Da/La is 1 or less is formed.

As described above, the depth D of the recess is shallower than the film thickness of the active layer of the TFT and becomes the order of 10 to several hundreds nm. On the other hand, the distance L between the recesses becomes the order of 0.1 to 1 μm. Thus, Da/La is made 0.1 or less, preferably 0.01 or less. The lower limit of Da/La becomes about 0.001 by the process precision.

In order to form a semiconductor thin film with a good step coverage in the recess of the insulating layer 104, it is appropriate that the, slope of the side surface of the recess 106 is moderated. Since the semiconductor thin film has a thickness of about 10 to 100 nm, as shown in FIG. 2, the slope of the side surface is made 50 nm or more in terms of radius of curvature r. From the viewpoint of the step coverage, it is preferable that the diameter ϕ of an inlet of the recess 106 is 10 nm or more, and this condition can be satisfied by the manufacturing steps of the following embodiment. The diameter ϕ of the recess 106 is smaller than the recess 101 of the substrate and is 1 μm or less.

Preferred embodiments of the present invention will then be described in detail with reference to FIGS. 1 to 18.

EMBODIMENT 1

In this embodiment, explanation will be made to a step of forming a smooth insulating film on a quartz substrate surface, a step of forming a semiconductor thin film having crystallinity regarded as single crystal on this insulating film, and a step of manufacturing a TFT using the obtained semiconductor thin film.

Figure 3A:
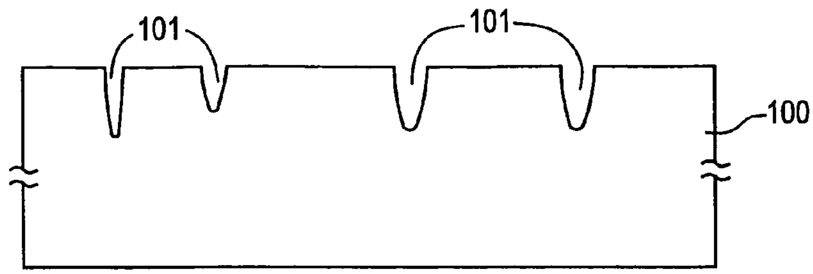
FIGS. 3A to 3D are views showing manufacturing steps of the under film of embodiment 1.

FIGS. 3A to 3D are explanatory views of manufacturing steps of an under film of this embodiment. As shown in FIG. 3A, an inexpensive low grade quartz substrate 100 is prepared. According to the AFM (Atomic Force Microscope), although the root-mean-square surface roughness Rms of the quartz substrate 100 is about 1 to 1.5 nm, recesses 101 with a depth of 30 to 60 nm and caved at a sharp angle exist irregularly.

Figure 3B:
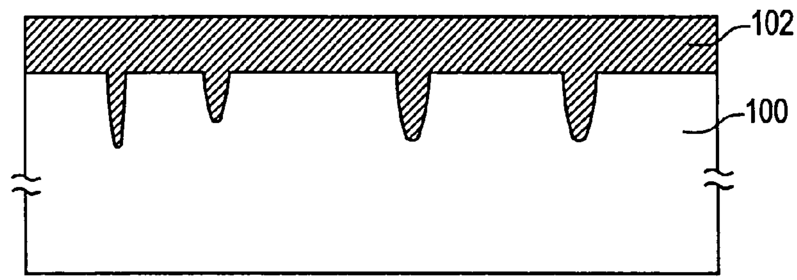

Next, as shown in FIG. 3B, an amorphous silicon film 102 is formed on the quart substrate 100 by a plasma CVD method or a sputtering method. Here, the amorphous silicon film 102 with a thickness of 350 nm is formed by the plasma CVD method. Although not shown here, recesses are formed on the surface of the amorphous silicon film 102 by the recesses 101 of the substrate 100, as shown in FIGS. 1 and 2.

Figure 3C:
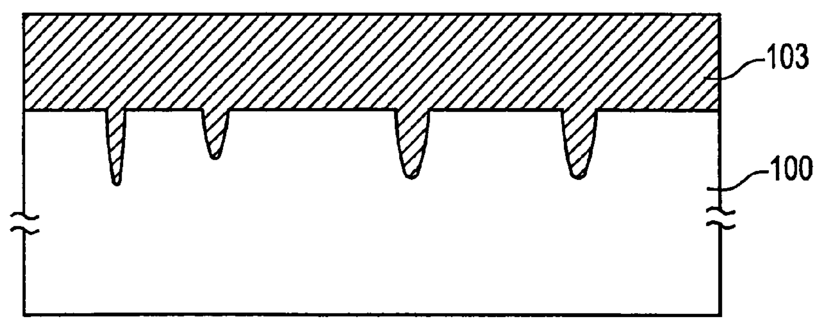

Next, as shown in FIG. 3C, the amorphous silicon film 102 is subjected to thermal oxidation in an atmosphere containing a halide gas (in this embodiment, HCl) to form a thermal oxidation film 103. It is possible to obtain a thermal oxidation film made denser and having a low interfacial level by adding halogen. The thickness of the thermal oxidation film 103 is about 700 nm.

FIG. 1A is an enlarged view of FIG. 3C. Since the amorphous silicon film 102 has recesses, the recesses 105*a* to 105*d* corresponding to the recesses 101*a* to 101*d* are formed on the surface of the thermal oxidation film 103. Thus, if there are such recesses 101 that an interval between the adjacent recesses 101 of the substrate is 0.3 μm or less, there is a portion where intervals p1, p2, p3, . . . of the adjacent recesses 101 becomes 0.3 μm or less. Further, if there are very deep recesses 101*a* to 101*d*, there is a possibility that a recess 105 having a depth of 10 nm or more exists in the thermal oxidation film 103.

Figure 3D:
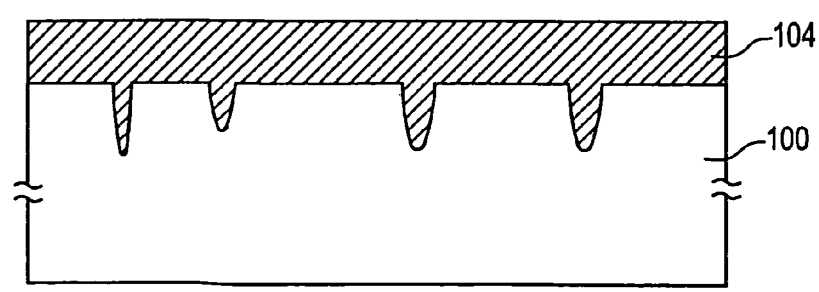

Thus, in this embodiment, as shown in FIG. 3D, flattening of the thermal oxidation film 103 is carried out to flatten the surface of the thermal oxidation film 103 so that the distance between the recesses of the insulating layer becomes 0.3 μm or more and the depth thereof becomes 10 nm or less. FIG. 1B is an enlarged view of FIG. 3D.

As means for flattening, mechanical polishing, chemical mechanical polishing (CMP), ELID (Electrolytic In-Process Dressing) and the like may be used. The ELID is a grinding method using a whetstone formed by firing cast iron powder mixed with diamond fine grains. A material to be polished is immersed in a water tank, and the whetstone is made an anode and water is made a cathode to generate an electric field, so that iron in the whetstone is dissolved and the diamond fine grains appear on the surface of the whetstone. Thus, setting of the whetstone is always carried out during grinding, so that it is possible to perform mirror grinding of a semiconductor material, a glass material, and the like in high precision.

In this embodiment, the surface layer of the thermal oxidation film 103 is polished to a depth of about 500 nm by the CMP. The remaining thermal oxidation film 103 is the under film 104. Thus, the film thickness of the amorphous silicon film 102 is determined in view of the thickness removed in the flattening step.

As shown in FIG. 1B, the depth of the recesses 106*a* to 106*c* of the under film 104 becomes shallow, and it can be made 10 nm or less, further, 5 nm or less. As shown by the dotted line, a relatively shallow recess 106*c* is made flat by polishing so that the smooth surface 107 can be obtained. Thus, since the number of the recesses 105 is reduced, the distance between recesses 106 of the insulating layer 104 is substantially lengthened, like interval L2, and it became 0.3 μm or more. The number of the recesses 105 per unit area was made 100 pieces/cm$^2$ or less.

Moreover, by the flattening step, the root-mean-square roughness Rms was made about 0.3 to 0.2 nm, the slope of the side surface of the recess 105 was moderated, and the radius of curvature r (see FIG. 2) of the side surface was made 50 nm or more. By moderating the slope, the step coverage at the side surface of the recess portion 105 can be improved. By making the radius of curvature r (see FIG. 2) 50 nm or more, it is possible to form a semiconductor thin film having a thickness of 100 nm to 10 nm with good covering properties.

By the steps shown in FIGS. 3A to 3D, it becomes possible to form the under film 104 having the smooth surface. After the flattening step, annealing is carried out to eliminate or decrease dislocations and defects of the surface layer of the under film 104 damaged at the polishing step. That is, it is important to carry out annealing to remove as many cause, which damages crystal growth of a crystalline silicon film formed on the under film 104 as possible.

Incidentally, in this embodiment, although the flattening step is carried out after the thermal oxidation step, it is also possible to form an under film satisfying the conditions of the present invention by carrying out thermal oxidation after flattening of the amorphous silicon film 102.

Figure 4A:
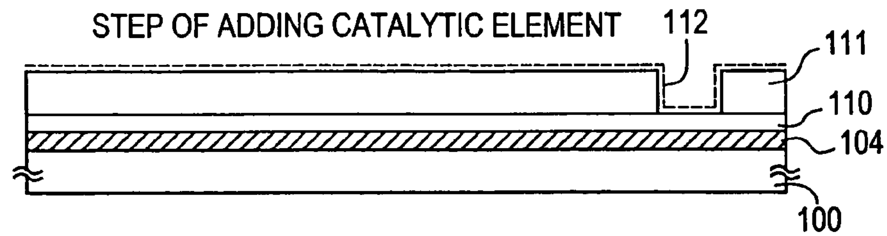
FIGS. 4A to 4E are views showing manufacturing steps of a crystalline silicon film of embodiment 1.

A method of forming a crystallized semiconductor thin film on the under film 104 having such a smooth surface will be described below with reference to FIGS. 4A to 4E. As shown in FIG. 4A, an amorphous silicon film 110 is formed on the under film 104. The film thickness of the amorphous silicon film 110 is adjusted so that a final film thickness (film thickness determined after paying consideration to a film decrease subsequent to thermal oxidation) becomes 10 to 75 nm (preferably 15 to 45 nm). In this embodiment, film formation is made by a low pressure CVD method and a film is formed under the conditions as follows:

film formation temperature: 465° C.;

film formation pressure: 0.5 torr; and film formation gas: He (helium) 300 sccm, $Si_2H_6$ (disilane) 250 sccm.

It is important to thoroughly manage the concentration of impurities in a film at the film formation. In the case of this embodiment, management is made so that the concentration of each of C (carbon) and N (nitrogen), which are impurities blocking crystallization in the amorphous silicon film 110, becomes less than $5\times10^{18}$ atoms/cm$^3$ (typically $5\times10^{17}$ atoms/cm$^3$ or less, preferably $2\times10^{17}$ atoms/cm$^3$ or less), and the concentration of O (oxygen) becomes less than $1.5\times10^{19}$ atoms/cm$^3$ (typically $1\times10^{18}$ atoms/cm$^3$ or less, preferably $5\times10^{17}$ atoms/cm$^3$ or less). This is because, if the concentration of any one of the impurities exceeds the above value, the impurity may have a bad influence at the time of the subsequent crystallization and may cause the film quality to be degraded after the crystallization.

Figure 18:
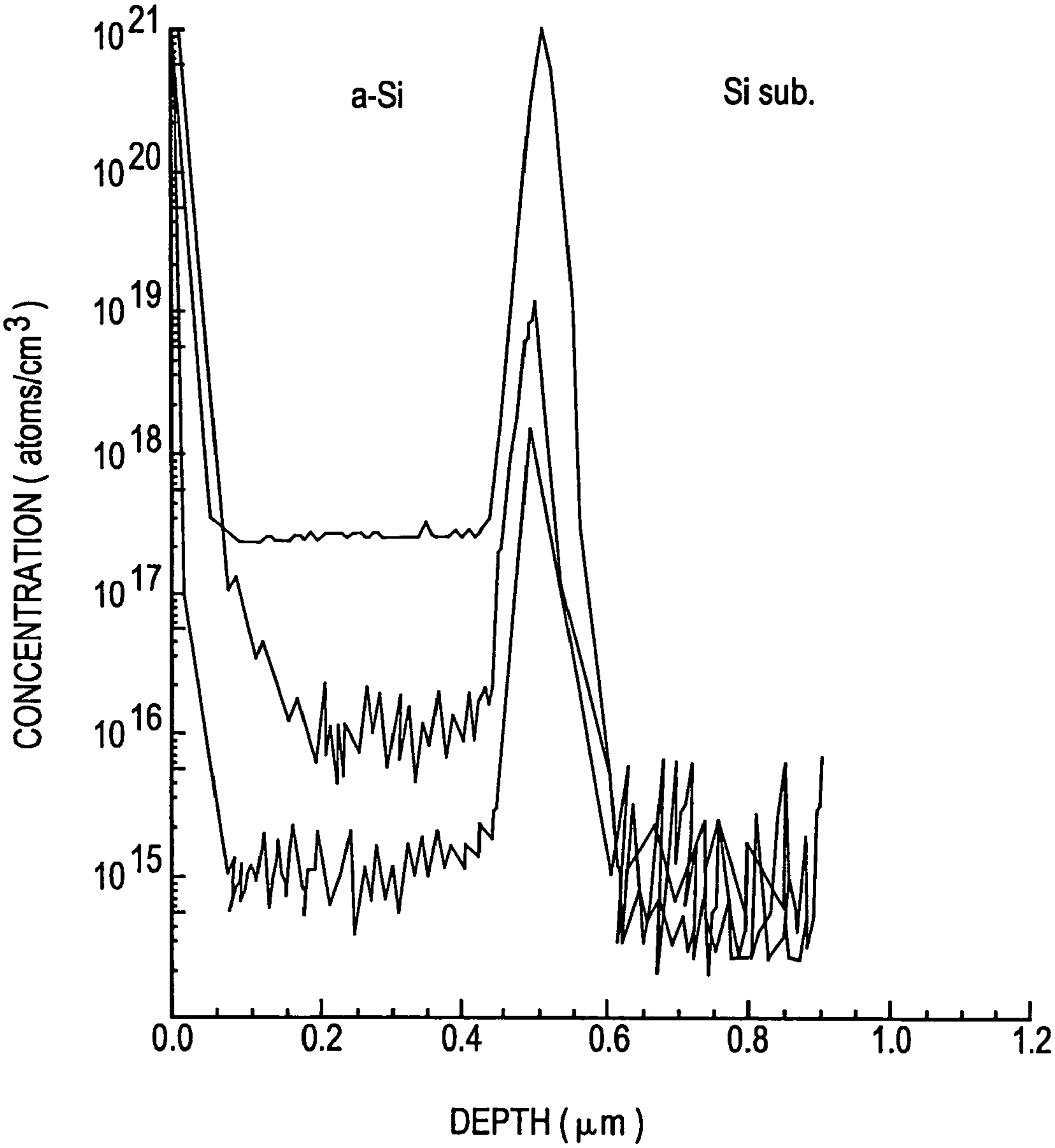
FIG. 18 is a view showing the measurement result of SIMS.
Figure 19A:
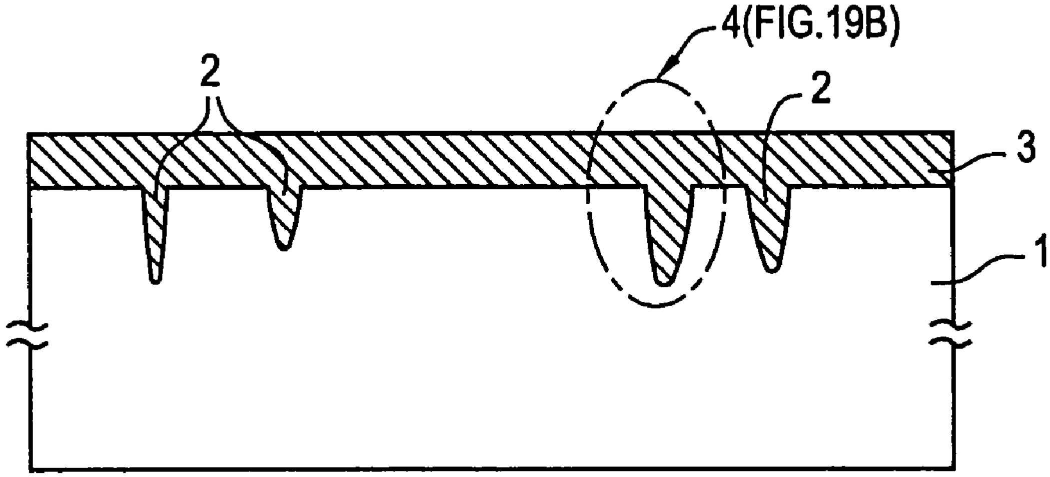
FIGS. 19A and 19B are sectional views showing a conventional under film.
Figure 19B:
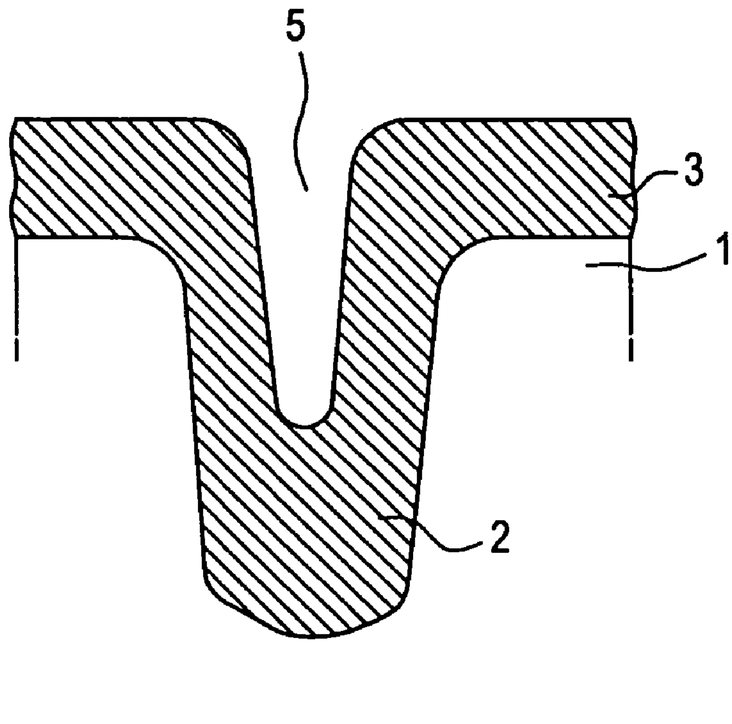

FIG. 18 shows the result of investigation by SIMS (Secondary Ion Mass Spectroscopy) for the concentration of impurities in the amorphous silicon film manufactured under the conditions of this embodiment. As a sample, an amorphous silicon film with a thickness of 0.5 μm formed on a silicon wafer was used. As a result, as shown in FIG. 18, it was ascertained that the concentration of any element of C, N and O was within the foregoing range. However, in the present specification, the concentration of an element in the film is defined as a minimum value among measurement results of the SIMS.

In order to obtain the foregoing structure, it is preferable that a low pressure CVD furnace used in this embodiment is subjected to periodic dry cleaning to clean a film formation chamber. As to the dry cleaning, it is appropriate that the film growth chamber is cleaned by fluorine generated by pyrolysis of a $ClF_3$ (chlorine fluoride) gas flown at a rate of 100 to 300 sccm into the furnace heated to about 200 to 400° C.

According to the knowledge of the present inventors, when the temperature in the furnace is 300° C. and the flow rate of the $ClF_3$ (chlorine fluoride) gas is 300 sccm, an attachment (containing silicon as the main ingredient) with a thickness of about 2 μm can be completely removed in 4 hours.

The concentration of hydrogen in the amorphous silicon film 110 is also a very important parameter, and it seems that as the hydrogen content is restricted to a low value, a film having excellent crystallinity is obtained. Thus, it is preferable that the amorphous silicon film 110 is formed by the low pressure CVD method. Incidentally, if the film growth condition is optimized, a plasma CVD method may be used.

Next, the amorphous silicon film 110 is crystallized. A technique disclosed in Japanese Patent Unexamined Publication No. Hei. 7-130652 by the present inventor is used as a means for crystallization.

Although both means of embodiment 1 and embodiment 2 disclosed in the publication may be used, in this embodiment, it is preferable to use the technical content (described in detail in Japanese Patent Unexamined Publication No. Hei. 8-78329) set forth in the embodiment 2 of the publication.

According to the technique disclosed in Japanese Patent Unexamined Publication No. Hei. 8-78329., a mask insulating film 111 for selecting an added region of a catalytic element is first formed. Then a solution containing nickel (Ni) as the catalytic element for promoting the crystallization of the amorphous silicon film 110 is applied by a spin coating method to form a Ni containing layer 112 (FIG. 4A).

As the catalytic element, cobalt (Co), iron (Fe), palladium (Pd), platinum (Pt), copper (Cu), gold (Au), Germanium (Ge), lead (Pb), Indium (In) or the like may be used other than nickel.

An adding step of the foregoing catalytic element is not limited to the spin coating method, but an ion implantation method or a plasma doping method using a resist mask may also be used. In this case, since it becomes easy to decrease an occupied area of an added region and to control a growth distance of the lateral growth region, the method becomes an effective technique when a minute circuit is formed.

Next, after the adding step of the catalytic element is ended, dehydrogenating is carried out at about 450° C. for 1 hour, and then a heat treatment is carried out in an inert gas atmosphere, a hydrogen atmosphere, or an oxygen atmosphere at a temperature of 500 to 700° C. (typically 550 to 650° C.) for 4 to 24 hours to crystallize the amorphous silicon film 110. In this embodiment, a heat treatment is carried out in a nitrogen atmosphere, at 570° C., and for 14 hours.

At this time, crystallization of the amorphous silicon film 110 proceeds with priority from nuclei produced in a region 113 added with nickel, and a crystal region 114 grown almost parallel to the surface of the substrate 100 is formed.

Figure 4B:
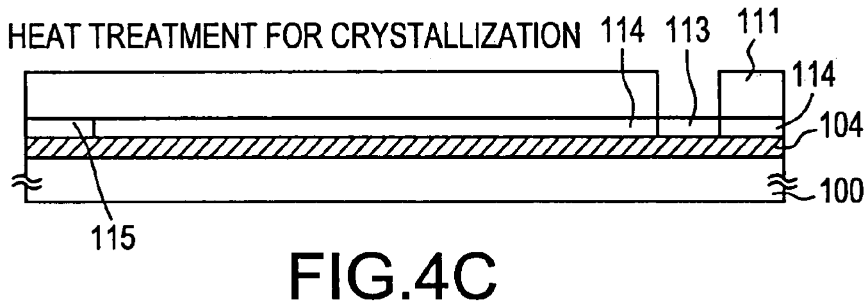

The present inventors refer to this crystal region 114 as a lateral growth region. Since respective crystals in the lateral growth region 114 are gathered in a comparatively uniform state, the lateral growth region has such an advantage that the total crystallinity is superior (FIG. 4B).

Figure 4C:
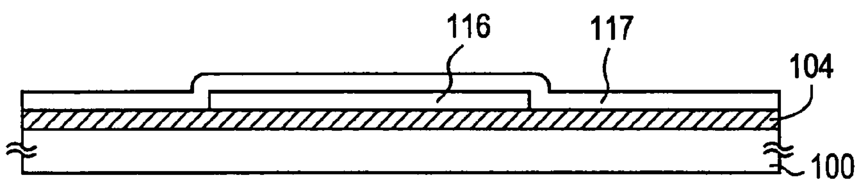

After the heat treatment for crystallization is ended, as shown in FIG. 4C, the mask insulating film 111 is removed, and patterning is carried out so that an island-like semiconductor layer 116 made of only the lateral growth region 114 is formed. Next, a deposition film 117 making a gate insulating film is formed. A silicon oxide film, a silicon nitride film, or a silicon nitride oxide film may be formed as the deposition film 117. It is appropriate that the film thickness is adjusted within the range of 20 to 250 nm in view of an increase of a gate oxidation film by a subsequent thermal oxidation step as well. As the film formation method, a well-known vapor phase method (plasma CVD method, sputtering method, etc.) may be used.

Figure 4D:
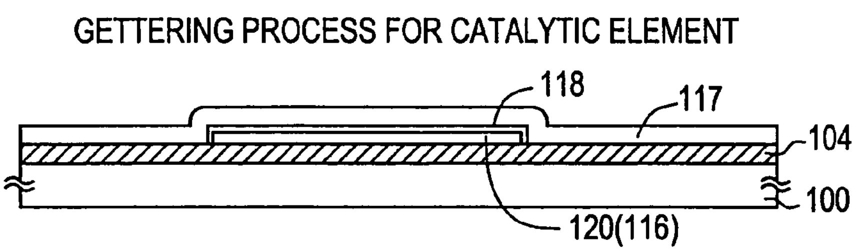

Next, as shown in FIG. 4D, a heat treatment (gettering process for the catalytic element) for removing or reducing the catalytic element (nickel) is carried out. In this heat treatment, a halogen element is made contained in a processing atmosphere and the gettering effect for a metallic element by the halogen element is used.

In order to sufficiently obtain the gettering effect by the halogen element, it is preferable to carry out the above heat treatment at a temperature exceeding 700° C. If the temperature is not higher than 700° C., it becomes difficult to decompose a halogen compound in the processing atmosphere, so that there is a fear that the gettering effect can not be obtained. Thus, the heat treatment is carried out preferably at a temperature of 800 to 1000° C. (typically 950° C.), and a processing time is made 0.1 to 6 hours, typically 0.5 to 1 hour.

As a typical embodiment, it is appropriate that a heat treatment is carried out at a temperature of 950° C. for 30 minutes in an oxygen atmosphere containing hydrogen chlorine (HCl) of 0.5 to 10 vol % (in this embodiment, 3 vol %). If the concentration of HCl is equal to or higher than the above-mentioned concentration, asperities comparable to a film thickness are formed on the surface of the active layer 116. Thus, such a high concentration is not preferable.

As a compound containing a halogen element, one kind or plural kinds of gases selected from compounds containing a halogen element, such as HF, $NF_3$, HBr, $Cl_2$, $ClF_3$, $BCl_3$, $F_2$, and $Br_2$, may be used other than the HCl gas.

In this step, nickel in the island-like region 116 is gettered by the action of chlorine and is transformed into volatile nickel chloride which is released into the air. By this gettering step, the concentration of nickel in the island-like region 116 is lowered down to $5\times10^{17}$ atoms/cm$^3$ or less (typically $2\times10^{17}$ atoms/cm$^3$ or less). A region 120 where the concentration of nickel has been decreased makes an active layer of a TFT. Incidentally, according to experiences of the present inventors, when the concentration of nickel is $1\times10^{18}$ atoms/cm$^3$ or less (preferably $5\times10^{17}$ atoms/cm$^3$ or less), the influence of nickel upon TFT characteristics can not be seen.

The above gettering process is also effective for metallic elements other than nickel. In the step, although constituent elements (typically aluminum, iron, chromium, etc.) of the film growth chamber are mainly regarded as metallic elements having a possibility of mixing into the silicon film during steps, if the foregoing gettering process is carried out, it is also possible to make the concentration of those metallic elements $5\times10^{17}$ atoms/cm$^3$ or less (preferably $2\times10^{17}$ atoms/cm$^3$ or less). When the foregoing gettering process is carried out, the halogen element that was used for the gettering process, having a concentration of $1\times10^{15}$ to $1\times10^{20}$ atoms/$cm^3$, remains in the island-like region 120.

Moreover, by the above heat treatment, a thermal oxidation reaction progresses at the interface between the island-like region 116 and the oxide film 117, so that a thermal oxidation film 118 is formed. The island-like region 116 not thermally oxidized becomes the active layer 120 of a TFT. The thermal oxidation film 118 and the deposition film 117 constitute the gate insulating film. When the thermal oxidation film 118 is formed after formation of the deposition film 117 in this way, it is possible to obtain an interface of semiconductor/insulating film which has very few-interfacial levels. Moreover, there is also an effect to prevent inferior formation (edge thinning) of the thermal oxidation film at the end of the active layer 120.

Further, it is also effective that after the heat treatment in the above-mentioned halogen atmosphere is carried out, a heat treatment approximately at 950° C. for one hour is carried out in a nitrogen atmosphere to improve the film quality of the gate insulating film.

Figure 4E:
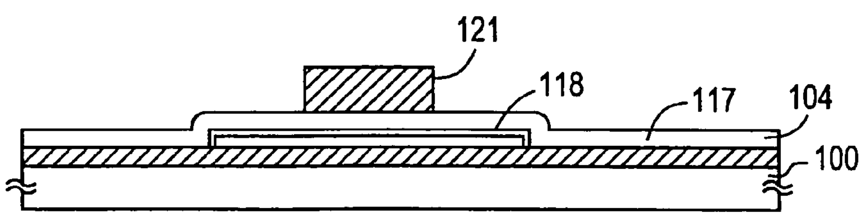

Next, a conductive film is formed and patterned to form an original 121 of a subsequent gate electrode. In this embodiment, an aluminum film containing scandium of 2 wt % is used. As other films, a tantalum film, a silicon film having conductivity, and the like may be used (FIG. 4E).

Here, a technique disclosed in Japanese Patent Unexamined Publication No. Hei. 7-135318 by the present inventors is used. The publication discloses the technique in which source/drain regions and a low concentration impurity region are formed in a self-aligning manner by using an oxide film formed by anodic oxidation. The technique will be described below in brief.

Figure 5A:
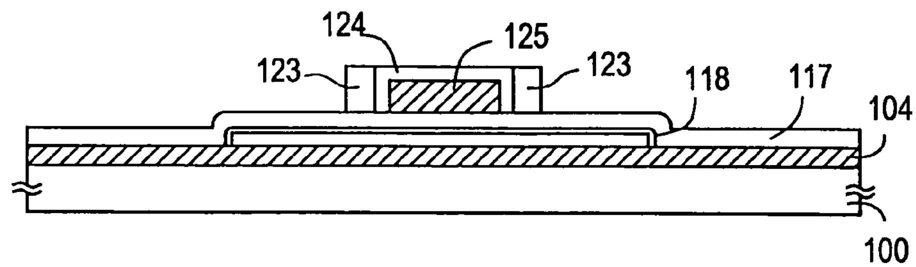
FIGS. 5A to 5D are views showing manufacturing steps of a semiconductor device of embodiment 1.

First, as shown in FIG. 5A, an anodic oxidation process is carried out in a solution of 3% oxalic acid while a resist mask (not shown) used for patterning of the aluminum film is left, so that a porous anodic oxidation film 123 is formed. Since this film thickness becomes the length of the low concentration impurity region, the film thickness is adjusted to meet the length.

Next, after removing the not-shown resist mask, an anodic oxidation process is carried out in an electrolytic solution of an ethylene glycol solution mixed with tartaric acid of 3%. In this process, a dense nonporous anodic oxidation film 124 is formed. It is appropriate that the film thickness is 70 to 120 nm.

An aluminum film 125 remaining after the foregoing two anodic oxidation processes substantially functions as a gate electrode (FIG. 5A).

Figure 5B:
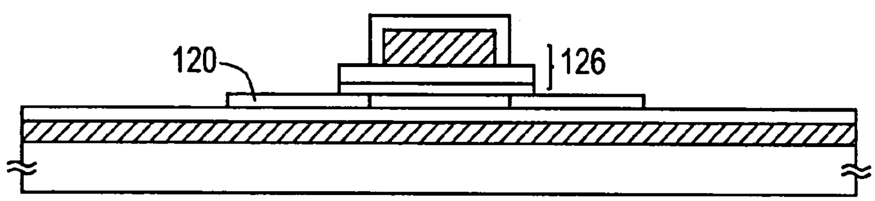

Next, the deposition film 117 and the thermal oxidation film 120 are etched by a dry etching method with the gate electrode 125 and the porous anodic oxidation film 123 as masks. Then the porous anodic oxidation film 123 is removed. A gate insulating film 126 is a multilayer made of the deposition film 117 and the thermal oxidation film 120, and the end portion of the gate insulating film 126 becomes an exposed state by the thickness of the porous anodic oxidation film 123 (FIG. 5B).

Next, an adding step of an impurity element for giving one conductivity is carried out. As the impurity element, it is appropriate that P (phosphorus) or As (arsenic) is used for an N type, and B (boron) or In (indium) is used for a P type.

In this step, a first impurity addition is carried out at a high acceleration voltage to form an n− region. At this time, since the acceleration voltage is as high as 80 KeV, the impurity element is added not only into the surface of the exposed active layer 120 but also into the portion under the end portion of the exposed gate insulating film 126. Further, a second impurity addition is carried out at a low acceleration voltage to form an n+ region. Since the acceleration voltage is as low as 10 keV at this time, the gate insulating film 126 functions as a mask.

Figure 5C:
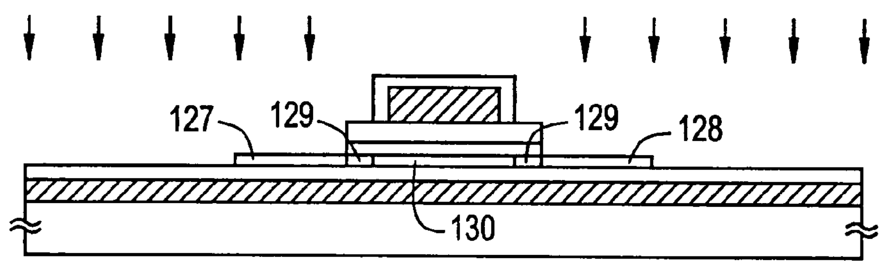

With respect to impurity regions formed through the above described steps, the n+ region becomes a source region 127 and a drain region 128, and the n− region becomes a pair of low concentration impurity regions (also called LDD region) 129. A region just under the gate electrode 125 is not added with the impurity element and becomes an intrinsic or substantially intrinsic channel formation region 130 (FIG. 5C).

After the active layer is completed in the manner described above, activation of the impurity is carried out by the combination of furnace annealing, laser annealing, lamp annealing and the like, and at the same time, damages applied to the active layer at the addition steps are also repaired.

Next, an interlayer insulating film 131 with a thickness of 500 nm is formed. A silicon oxide film, a silicon nitride film, a silicon nitride oxide film, an organic resin film, or a lamination film thereof may be used as the interlayer insulating film 131.

Figure 5D:
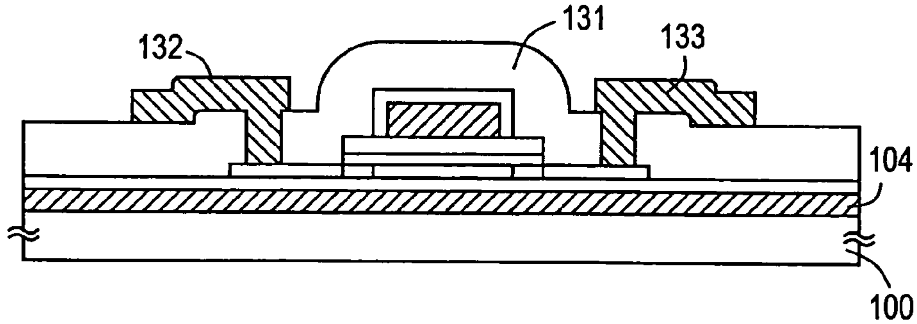

Next, after contact holes are formed, a source electrode 132 and a drain electrode 133 are formed. Finally, the entire substrate is heated in a hydrogen atmosphere at 350° C. for 1 to 2 hours to hydrogenate the entire component so that dangling bonds (unpaired bonds) in the film (especially, in the active layer) are terminated. Through the above steps, the TFT having the structure as shown in FIG. 5D can be manufactured.

Since the main structure of the present invention is a technique relating to a semiconductor thin film making an active layer and an under film of the semiconductor thin film, structure and constitution other than the main structure do not limit the present invention at all. Thus, the present invention can be easily applied to a TFT having structure and constitution other than this embodiment.

Although the silicon film is used as a semiconductor film in this embodiment, it is also effective to use a silicon film containing germanium of 1 to 10% as expressed by $Si_XGe_{1-X}$ ($0<X<1$, preferably $0.05\leqq X\leqq0.95$).

In the case where such a compound semiconductor film is used, the threshold voltage can be made small when an N-type TFT and a P-type TFT are manufactured. Moreover, the field-effect mobility (called mobility) can be made large.

[Findings as to Crystal Structure of an Active Layer]

The active layer 120 formed in accordance with the manufacturing steps shown in FIGS. 3 and 4 has microscopically a crystal structure in which a plurality of rod-like (or flattened rod-like) crystals are arranged in almost parallel to each other and with regularity to a specific direction. This can be easily confirmed by observation with a TEM (Transmission Electron Microscope).

Figure 23A:
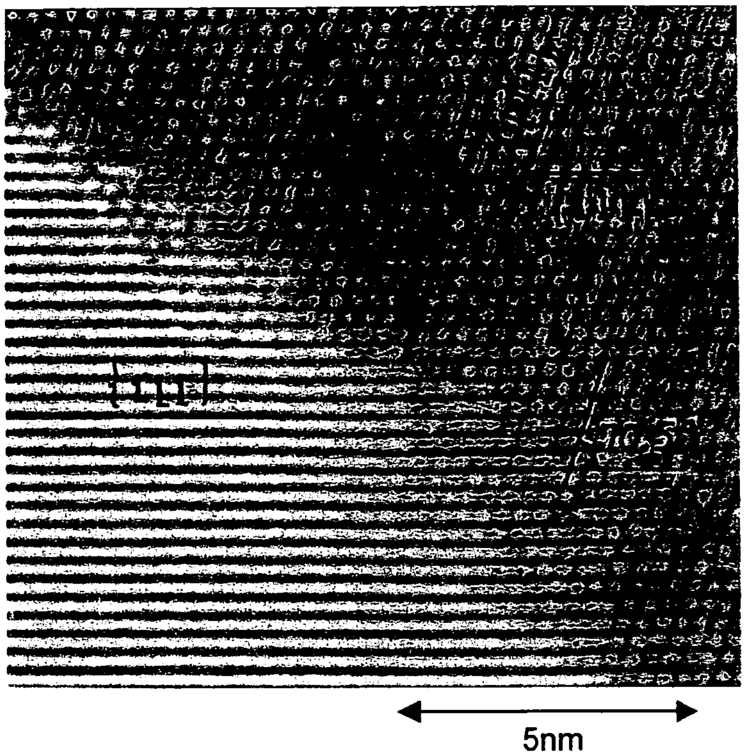
FIGS. 23A and 23B are TEM photographs showing crystal grains of semiconductor thin films.
Figure 23B:
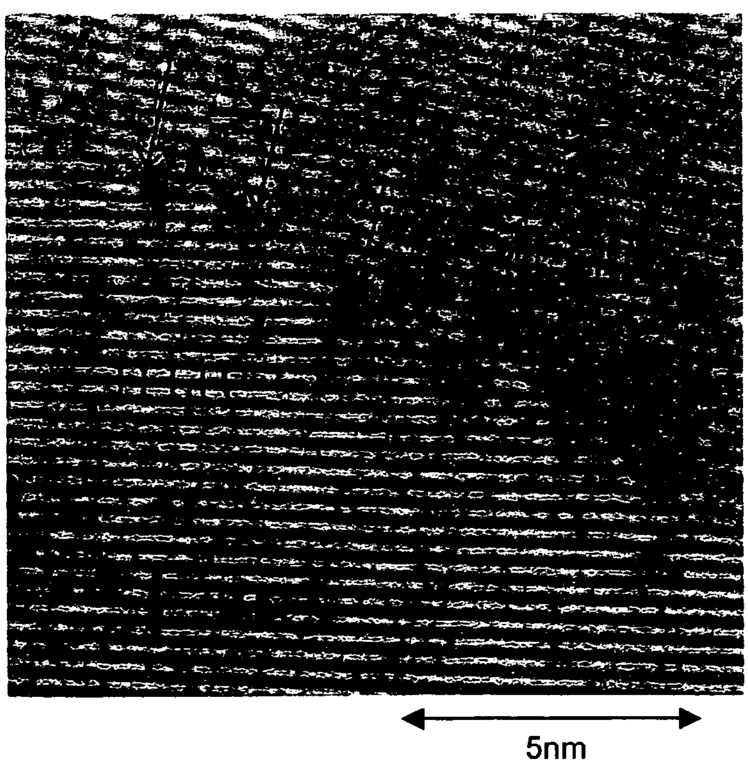

FIGS. 23A and 23B are HR-TEM photographs showing crystal grain boundaries of rod-like or flattened rod-like crystals, magnified eight million times. In the present specification, the crystal grain boundary is defined as a grain boundary formed at an interface where rod-like or flattened rod-like crystals are in contact with each other. Thus, the crystal grain boundary is regarded as different from, for example, a macroscopic grain boundary formed by collision of separate lateral growth regions.

Incidentally, the foregoing HR-TEM (High Resolution Transmission Electron Microscope) is a method in which a sample is vertically irradiated with an electron beam, and the arrangement of atoms and molecules is estimated by using interference of transmitted electrons or elastically scattered electrons.

In the HR-TEM, it is possible to observe the state of arrangement of crystal lattices as lattice stripes. Thus, by observing the crystal grain boundary, it is possible to infer the bonding state of atoms in the crystal grain boundary.

Incidentally, although lattice stripes appear as stripe patterns of black and white, they show the difference in contrast, and do not show the positions of atoms.

FIG. 23A is a typical TEM photograph of a crystalline silicon film obtained by the present invention, and the state where two different crystal grains are in contact with each other at the crystal grain boundary seen from the upper left to lower right in the photograph is observed. At this time, the two crystal grains were almost in {110} orientation although some deviations were included in crystal axes.

Although to be described later, as the result of investigation of a plurality of crystal grains, it is confirmed by X-ray diffraction or electron beam diffraction that almost all crystal grains are substantially in the {110} orientation. Although many observed crystal grains ought to include a (011) plane, a (200) plane and the like, those equivalent planes will be expressed together by a {110} plane.

As shown in FIG. 23A, lattice stripes corresponding to a {111} plane and a {100} plane are observed in a face. Incidentally, the lattice stripe corresponding to the {111} plane indicates such a lattice stripe that when a crystal grain is cut along the lattice stripe, the {111} plane appears in the section. In a simplified manner, it is possible to confirm by the distance between the lattice stripes to what plane the lattice stripe corresponds.

The reason why there is a difference in the appearance of the lattice stripes in FIG. 23A is that the slopes of the crystal grains are subtly different. That is, when it is designed so that the crystal face of one of crystal grains is vertically irradiated with an electron beam, the other crystal grain is obliquely irradiated with the electron beam. Thus, the appearance of the lattice stripe is changed.

Here, attention is paid to the lattice stripe corresponding to the {111} plane. In FIG. 23A, the lattice stripe corresponding to the {111} plane of the crystal grain at the upper side above the grain boundary intersects the lattice stripe corresponding to the {111} plane of the crystal grain at the lower side at an angle of about 70° (precisely 70.5°).

Such crystal structure (precisely, structure of crystal grain boundary) shows that two different crystal grains are in contact with each other with extremely excellent conformity. That is, the crystal lattices are continuous at the crystal grain boundary so that they become such a structure that it is very hard to produce trap levels due to crystal defect or the like. In other words, it can be said that the crystal lattices have continuity at the crystal grain boundary.

For reference, FIG. 23B shows an HR-TEM photograph of a conventional high-temperature polysilicon film. In the case of FIG. 23B, although described later, there was no regularity in the crystal surface, and the orientation was not such that the {110} plane became main. However, for the comparison to FIG. 23A, such crystal grains that the lattice stripe corresponding to the {111} plane appeared was observed.

When FIG. 23B is observed in detail, as shown by arrows in the drawing, many portions where the lattice stripes are disconnected can be confirmed in the crystal grain boundary. In such portions, there are uncombined bonds (which can be called crystal defects), and there is a high possibility that as trap levels, they block the movement of carriers.

However, it is certain that the crystalline silicon film of the present invention also includes uncombined bonds as shown in FIG. 23B. This is inevitable as long as the crystalline silicon film of the present invention is polycrystal. However, as the result of TEM observation in detail for the crystalline silicon films of the present invention over a wide range, it has been found that such uncombined bonds are very few.

As long as the investigation by the present inventors, crystal grain boundaries of 90% or more of the whole (typically 95% or more) were seen to have continuity of crystal lattices, and uncombined bonds as shown in FIG. 23B could be hardly found.

Also from this feature, it can be said that the crystal silicon film of the present invention is clearly different from conventional high-temperature polysilicon.

Figure 6A:
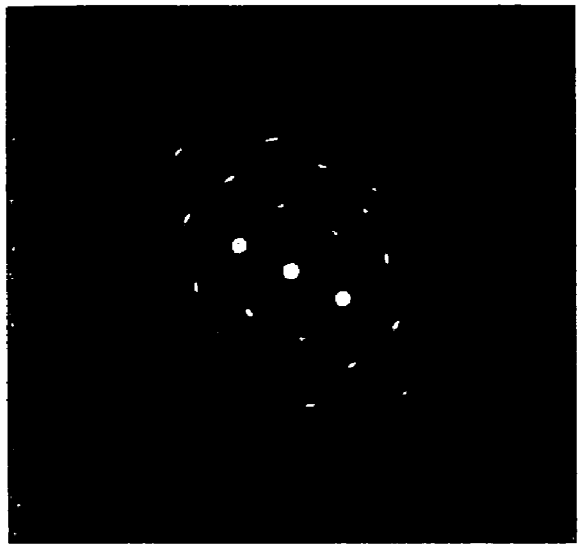
FIGS. 6A and 6B are photographs showing electron diffraction patterns of semiconductor thin films.
Figure 6B:

FIG. 6A shows the result of investigation of the semiconductor thin film of the present invention by an electron beam diffraction. For reference, FIG. 6B shows an electron beam diffraction pattern of a conventional high temperature polysilicon film. In FIGS. 6A and 6B, the diameters of irradiation areas of the electron beams are 4.25 μm and 1.35 μm, respectively. In this embodiment, typical photographs are shown among measurements of plural positions.

In the case of FIG. 6A, diffraction spots corresponding to <110> incidence appear comparatively clearly, and it is ascertained that almost all crystal grains are in the {111} orientation within the irradiation area of the electron beam.

The present inventors performed X-ray diffraction in accordance with a method disclosed in Japanese Patent Unexamined Publication No. Hei. 7-321339, and calculated the ratio of orientation with respect to the semiconductor thin film of the present invention. In the publication, the ratio of orientation is defined with the calculation method as indicated by the following expression 1:

{220} orientation existence ratio=1 (constant),

{111} orientation existence ratio=(relative strength of {111} to {220} of a sample)/(relative strength of {111} to {220} of powder), {311} orientation existence ratio=(relative strength of {311} to {220} of a sample)/(relative strength of {311} to {220} of powder), and {220} orientation ratio=({220} orientation existence ratio)/({220} orientation existence ratio+{111} orientation existence ratio+{311} orientation existence ratio). [Expression 1]

As the result of investigation of the orientation of the semiconductor thin film of the present invention by the X-ray diffraction, a peak corresponding to a (220) plane appears. Of course, it is needless to say that the (220) plane is equivalent to the {110} plane. As the result of this measurement, it was found that the {110} plane is the main oriented plane, and the orientation ratio is 0.7 or more (typically 0.9 or more).

On the other hand, in the case of a conventional high temperature polysilicon film shown in FIG. 6B, it was found that definite regularity could not be seen in the diffraction spots, and they were oriented almost at random, in other words, crystal grains with plane orientation other than the {110} plane were irregularly mixed.

Although the respective diffraction spots have a small concentric expanse, it is presumed that this is caused by a distribution of rotation angles of some degree around a crystal axis. This will be described below.

Figure 7A:
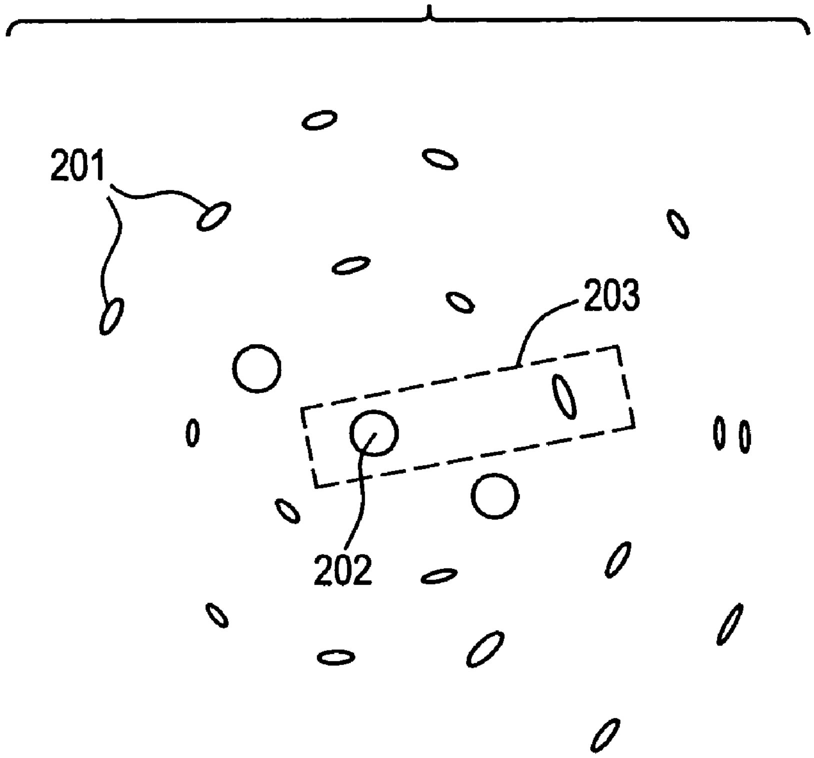
FIGS. 7A and 7B are views schematically showing an electron beam diffraction pattern.

FIG. 7A schematically shows a part of the electron beam diffraction pattern shown in FIG. 6A. In FIG. 7A, a plurality of bright points designated by 201 are diffraction spots corresponding to the <110> incidence. The plurality of diffraction spots 201 are concentrically distributed with a center point 202 of the irradiation area as the center.

Figure 7B:
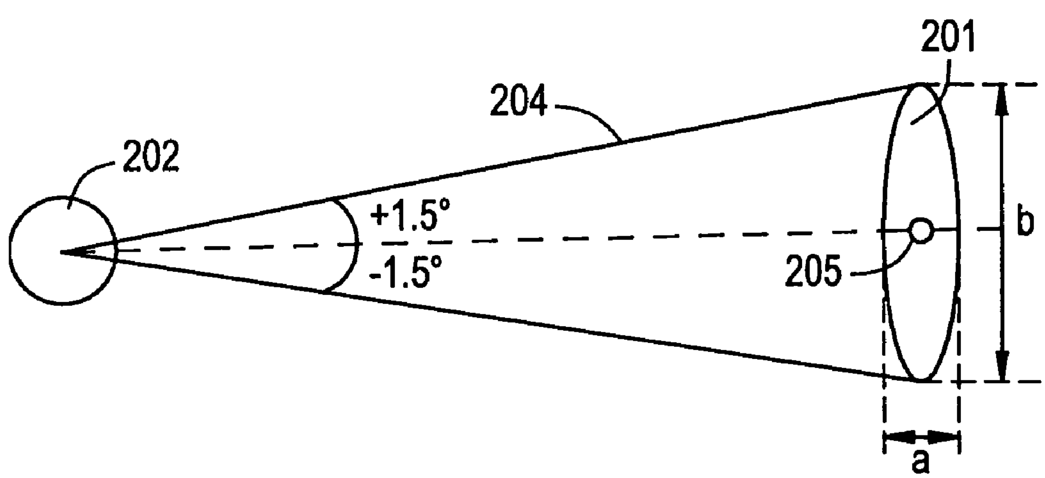

FIG. 7B is an enlarged view showing a region 203 surrounded by a dotted line. As shown in FIG. 7B, when the electron beam diffraction pattern shown in FIG. 6A is observed in detail, it is understood that the diffraction spot 201 has an expanse (fluctuation) of about ±1.5° with respect to the center point 202 of the irradiation area.

That is, it is meant that an angle (corresponding to a half of a rotation angle) between a tangential line 204 drawn from the center point 202 of the electron beam irradiation area to the diffraction spot 201 and a line connecting the center point 202 of the electron beam irradiation area and a center point 205 of the diffraction spot is 1.5° or less. At this time, since two tangential lines can be drawn, the expanse of the diffraction spot 201 is eventually within ±1.5°.

This tendency is seen in the entire regions of the electron beam diffraction pattern shown in FIG. 6A, and in total, the expanse is within ±2.5° (typically within ±1.5°, preferably within ±0.5°). The foregoing statement "the respective diffraction spots have a small concentric expanse" means this.

When the under film of the semiconductor thin film is made flat without limit, the ratio (a/b) of the length (a) of a short axis and the length (b) of a long axis of the diffraction spot 201 can be made 1/1 (which means a circle) to 1/1.5. This means that the diffraction spot becomes circular or substantially circular.

In order that the diffraction spot becomes circular, a rotation angle existing among a plurality of crystal grains must be made very small. When it is considered that a diffraction spot becomes completely circular in an electron beam diffraction pattern of single crystal, that the diffraction spot becomes circular is simply that the semiconductor thin film of the present invention approaches single crystal without limit.

Figure 8A:
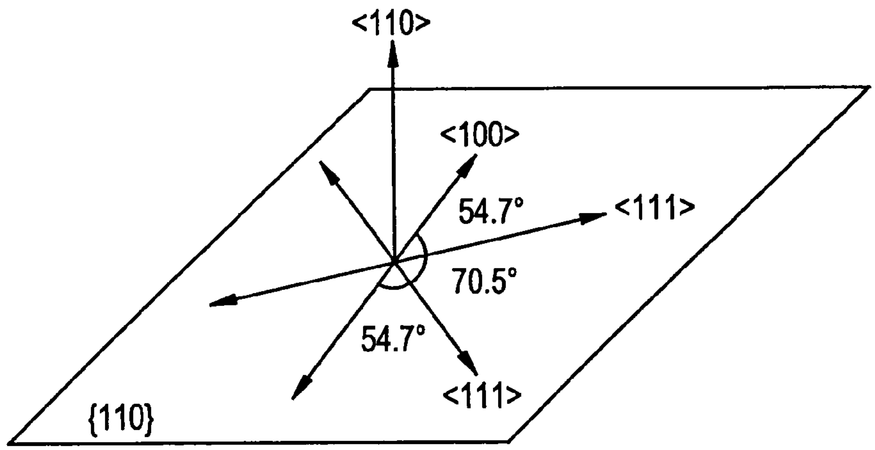
FIGS. 8A to 8C are views for explaining the orientation relation of a semiconductor thin film.
Figure 8B:
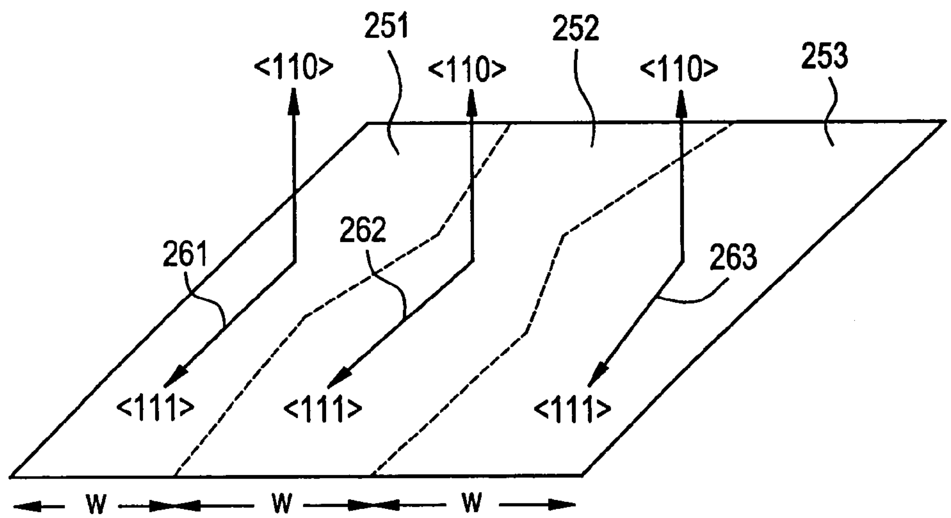
Figure 8C:
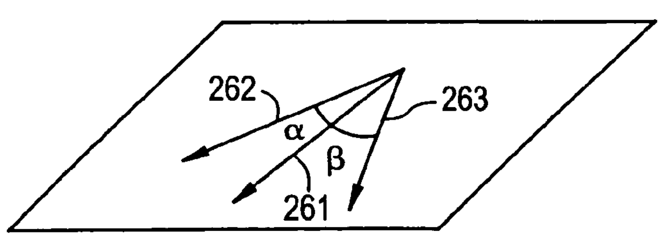

FIGS. 8A to 8C schematically show the relation between the plane orientation of a crystal grain and the crystal axis. FIG. 8A shows the relation between the crystal axis in the case where the plane orientation is {110} and an axis contained in the crystal plane. Like this, when the crystal plane is in the {110} orientation, the crystal axis is the <110> axis, and a <111> axis, a <100> axis, and the like are included in the crystal plane.

As the result of the previous investigation of grown direction of the foregoing rod-like crystal performed by the present inventors by using the HR-TEM, it is ascertained that the rod-like crystal grows substantially in the direction of the <111> axis (see Japanese Patent Unexamined Publication No. Hei 7-321339). Thus, when a part of the semiconductor thin film of the present invention is enlarged, it is conceivable that the part is such as shown in FIG. 8B.

In FIG. 8B, reference numerals 251 to 253 denote rod-like crystals different from each other, and the crystal axes of the respective crystal grains are substantially the <110> axes. Since the crystal growth on the average progresses substantially toward the direction of the <111> axis, the direction of extension of the rod-like crystal substantially coincides with the direction of the <111> axis. Incidentally, the portion indicated by a dotted line is a crystal grain boundary.

At this time, when the <111> axis 261 contained in the plane of an arbitrary crystal grain 251 is made a reference axis, <111> axes 262 and 263 contained in the planes of other rod-like crystals 252 and 253 that exist in the vicinity coincide with the reference axis 261 or slightly shifted so that they have some angle with respect to the reference axis 261. In this specification, this angle will be referred to as a rotation angle.

The foregoing statement "the expanse of the diffraction spot is within ±2.5° (typically within ±1.5°, preferably within ±0.5°)" is equivalent to, in other words, the statement that the absolute value of the rotation angle is within 5° (typically within 3°, preferably 1°).

When this relation is summarized in a simple way as shown in FIG. 8C, in the semiconductor thin film of the present invention, an angle ($\alpha$) between the axis 262 and the reference axis 261, and an angle ($\beta$) between the axis 263 and the reference axis 261 are rotation angles. This rotation angle is within 5°.

As shown in FIG. 8B, the respective crystal grains having subtle rotation angles appear on the electron beam diffraction pattern as different diffraction spots. For example, the diffraction spots of the crystal grains 252 and 253 appear on a concentric circle shifted by the rotation angles $\alpha$ and $\beta$ from the diffraction spot of the crystal grain 251.

That is, when a plurality of crystal grains exist in the irradiation area of an electron beam, diffraction spots corresponding to a plurality of crystal grains are continuously placed on a concentric circle, and the respective diffraction spots apparently come to show a shape similar to an ellipse. This is the reason why the expanse of the diffraction spot is seen in the electron beam diffraction pattern of FIG. 6A.

Although the notation such as<111> is used in this embodiment, a plurality of equivalent axes such as [111] or [1−11] (the minus symbol means inversion) are included therein. That is, the diffraction spots appear correspondingly to all equivalent axes, and as the result, the electron beam diffraction pattern as shown in FIG. 6A are formed. Thus, if the crystal grain is rotated by a rotation angle, the electron beam diffraction pattern is also rotated in the mass by the rotation angle. Accordingly, any diffraction spot has an expanse on the concentric circle.

As described above, it can be interpreted that the reason why the diffraction pattern as shown in FIG. 6A is obtained as the result of investigation of the semiconductor thin film of the present invention by the electron beam diffraction is that a plurality of rod-like crystals exist in the irradiation area of the electron beam and they have rotation angles slightly different from each other. Besides, from the state of the expanse of the diffraction spot, it is conceivable that the absolute value of the rotation angle is within 5° (typically within 3°, preferably within 1°).

This means that among all crystal grains constituting the semiconductor thin film of the present invention, even between two crystal grains having the largest rotation angles, a shift from an arbitrary reference axis is within at least 5°.

Here, in accordance with the category of crystal grain boundaries commonly used, the degree of existence of various crystal grain boundaries in the semiconductor thin film of the present invention will be described. The table shown below takes data relating to the semiconductor thin film of the present invention into consideration.

TABLE 1

| Kind of crystal grain boundary | | Feature | Semi-conductor thin film of the present invention | Remarks |
|---|---|---|---|---|
| Low angle grain boundary (substantially rotational relation within 15 degrees) | Small tilt angle grain boundary | Slight rotation with respect to orientation included in the boundary plane | Not exist or substantially not exist | If these grain boundaries do not exist or are very few, the film is regarded as single crystal or substantially single crystal |
| | (small) Twist grain boundary | Slight rotation with respect to vertical orientation to the boundary plane | | |
| Specific high angle grain boundary | Twin crystal grain boundary | Rotation of 180 degrees with respect to a common orientation | Many (especially Σ3) | Since these grain boundaries are electrically inactive, even if they exist, the film is regarded as single crystal or substantially single crystal |
| | Other corre-sponding grain boundary | Common lattice point exists at a fixed ratio over the grain boundary to each other | Few | |
| Random high angle grain boundary | | There is no meaningful relation of orientation | Not exist or substantially not exist | If this kind of grain boundary exists, the film can not possibly be regarded as single crystal |

Incidentally, the shape of the crystal grain boundaries shown in Table 1 can be distinguished from each other by freely using electron beam diffraction, HR-TEM, section TEM, and the like, and more detailed information can be obtained. Incidentally, the value of the rotation angle in the present specification is measured by analyzing the crystal grain boundary from various angles by combining the above methods.

Since the foregoing rotation around the crystal axis is "rotation with respect to orientation included in the boundary plane", it is contained in the small tilt angle grain boundary. In the case where such a crystal grain boundary is formed, two crystal grains 271 and 272 are in contact with each other in the relation schematically shown in FIG. 9A, and have an axis 273 as a rotating axis. In this case, the plane where the two crystal grains are in contact with each other, is the boundary plane. In the semiconductor thin film of the present invention, the rotation angle around this crystal axis is as very small as ±2.5° or less.

Figure 9A:
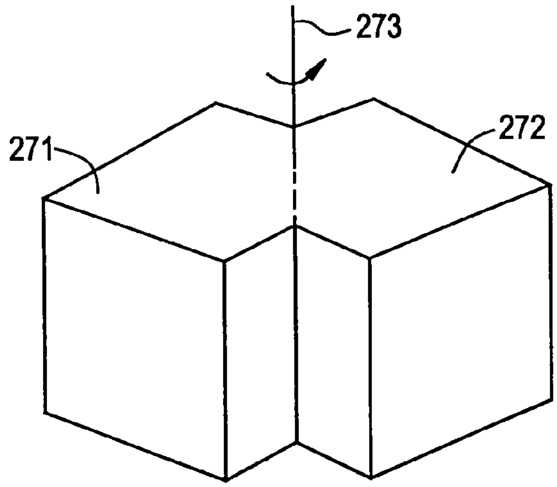
FIGS. 9A to 9C are views showing the shapes of crystal grain boundaries.
Figure 9B:
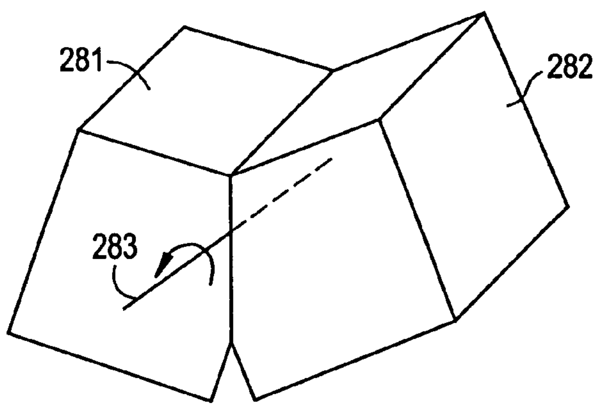

The small tilt angle grain boundary includes also a case as shown in FIG. 9B. In the shape of FIG. 9B, an axis which becomes the rotation axis 273 is different from FIG. 9A. However, the feature that two crystal grains 281 and 282 have relation of making a rotation angle 283 with the center of an axis included in the boundary plane is similar to FIG. 9A. In the semiconductor thin film of the present invention, since the rotation angle in this case is also within ±2.5° (typically within ±1.5°, preferably within ±0.5°), it can be considered that such crystal grains 281 and 282 scarcely exist.

Figure 9C:
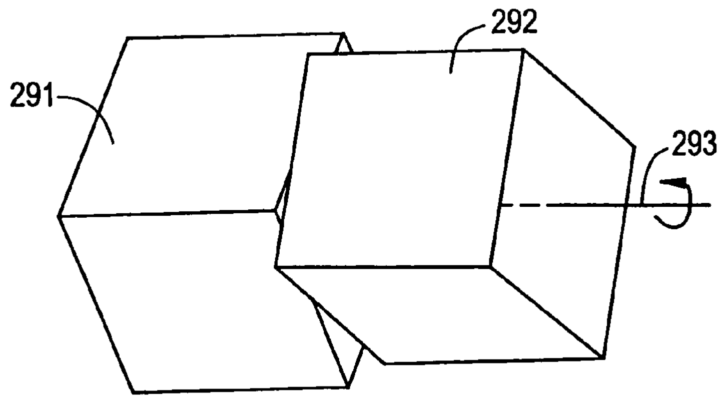

Although it is distinguished from the small tilt angle grain boundary shown in FIGS. 9A and 9B, there is a shape called a twist grain boundary in the same category of the low angle grain boundary. This corresponds to the case where a grain is rotated in an orientation vertical to a boundary plane as shown in FIG. 9C.

Also in this case, the feature that two crystal grains 291 and 292 have relation of making a rotation angle 293 is similar to the small tilt angle grain boundary, and in the semiconductor thin film of the present invention, the rotation angle is within ±2.5° (typically within ±1.50, preferably within ±0.5°). That is, it can be considered that the twist grain boundary also scarcely exists.

As described above, the semiconductor thin film of the present invention can be considered that there is no or substantially no electrically active crystal grain boundary, which is generally called a low angle grain boundary. Incidentally, the words "electrically active" mean that the carrier can function as a trap.

Besides, the words "substantially no" mean that for example, when crystal grain boundaries included in the range of 5 μm square are investigated, even if a specified grain boundary (for example, low angle grain boundary or the like) exists, the number thereof is one or two.

Specific high angle grain boundaries include a twin crystal grain boundary and other corresponding grain boundary, and it is confirmed that almost all semiconductor thin films of the present invention have this twin crystal grain boundary. It has been found that even if the corresponding grain boundary exist, it is electrically inactive (does not function as a trap of a carrier).

Especially, in the semiconductor thin film of the present invention, the corresponding grain boundary of Σ3 ({111} twin crystal grain boundary) occupies 90% or more (typically 95% or more) of the whole, and it is verified in a wide range that crystal grain boundaries with very excellent conformity are formed.

Incidentally, the Σ value is a parameter which is an index showing the degree of conformity of a corresponding grain boundary. It is known that as the Σ value is small, the conformity of the crystal grain boundary is superior. The definition of the Σ value is described in detail in "High Resolution Electron Microscope for Estimation of Material; Daisuke Sindo, Kenji Hiraga, pp. 54 to 60, Kyoritsu Shuppan Co Ltd., 1996".

In the crystal grain boundary formed between two crystal grains, when the plane orientations of both the crystal grains are {110}, and if an angle formed by lattice stripes corresponding to the {111} plane is θ, it is known that when θ is 70.5°, the boundary becomes the corresponding grain boundary of Σ3.

Thus, in the crystal grain boundary shown in the TEM photograph of FIG. 23A, the respective lattice stripes of adjacent crystal grains are continuous at an angle of 70.5°, so that it is easily presumed that this crystal grain boundary is the {111} twin crystal grain boundary.

Incidentally, when θ is 38.9°, the boundary becomes the corresponding grain boundary of Σ9. Such other crystal grain boundary also existed although the amount thereof is small.

Such a corresponding grain boundary is formed only between crystal grains of the same plane orientation. That is, since the plane orientation of the semiconductor thin film of the present invention is uniform as substantially {110}, such a corresponding boundary can be formed over a wide range. This feature can not be obtained by other polysilicon films in which the plane orientation is irregular.

The random high angle grain boundary is a grain boundary seen in the semiconductor thin film which has no meaningful orientation relation and in which crystal grains of irregular orientation are merely lined, and is often seen in a semiconductor thin film such as a conventional high temperature polysilicon film. In the semiconductor thin film of the present invention, it is natural that the high angle grain boundary hardly exists.

In the case where both the low angle grain boundary and the random high angle grain boundary shown in Table 1 do not exist or the number thereof is very small, it can be considered that active crystal grain boundaries do not exist. That is, the semiconductor thin film having such a crystal structure can be regarded as single crystal having substantially no crystal grain boundary or substantially as single crystal.

As described above, the semiconductor thin film of the present invention has orientation relation such that the respective crystal grains (rod-like crystals) constituting the thin film completely coincide in orientation with each other or they have rotation angles of some degree. The rotation angle is as very small as ±2.5° or less, which is on the level that a crystal grain boundary is not substantially formed.

The present inventors pay importance to the flatness of an under film as the reason why such a semiconductor thin film can be obtained. According to the experiences of the present inventors, when the under film has asperities, they have a large influence on the crystal growth. That is, the asperities or the like of the under film produce distortion or the like in a crystal grain and causes a shift of a crystal axis and so forth.

The semiconductor thin film of the present invention is formed on the under film having very high flatness formed by the method described in this embodiment. Thus, since the film can be grown in the state where factors blocking crystal growth are removed to the utmost, crystal grains are combined with each other while very high crystallinity is maintained. As a result, it is conceivable that the semiconductor thin film having crystallinity, which can be substantially regarded as single crystal, can be obtained as described above.

Incidentally, in the formation of the foregoing semiconductor thin film, an annealing step at a temperature above a crystallizing temperature (temperature at the heat treatment carried out in the crystallizing step of silicon) plays an important role with respect to the lowering of defects in a crystal grain. This will be described.

Figure 21A:
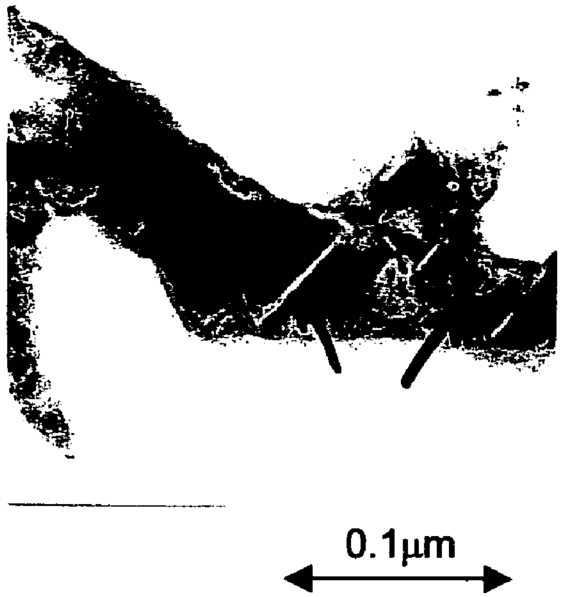
FIGS. 21A and 21B are TEM photographs showing crystal grains of crystalline silicon films.

FIG. 21A is a TEM photograph of a crystalline silicon film at a time when the steps up to the crystallizing step shown in FIG. 4B have been ended, which is magnified 250 thousands times. Zigzag defects as indicated by arrows are confirmed in the crystal grain (black portion and white portion appear due to difference in contrast).

Although such defects are mainly a lamination defect in which the order of lamination of atoms on a silicon crystal lattice plane is discrepant, there is also a case of dislocation or the like. It appears that FIG. 21A shows the lamination defect having a defect plane parallel to the {111} plane. This can be inferred from the fact that the zigzag defects are bent at about 70°.

Figure 21B:
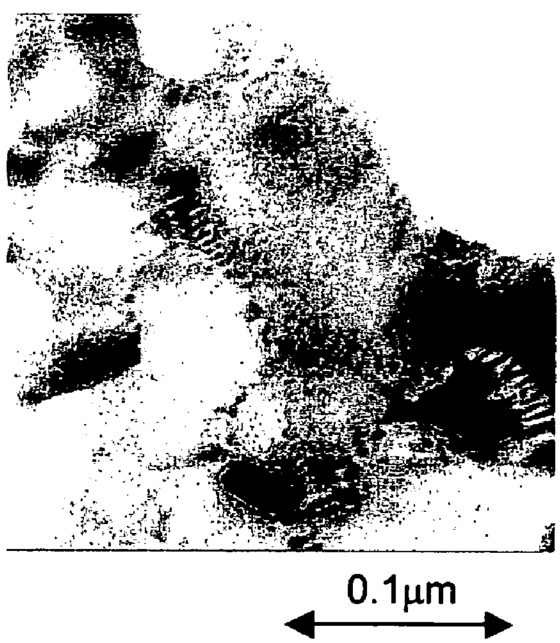

On the other hand, as shown in FIG. 21B, in the crystalline silicon film of the present invention, which is magnified at the same magnification, it is confirmed that there are hardly seen defects caused by the lamination defect, dislocation and the like, and the crystallinity is very high.

This tendency can be seen in the entire of the film surface, and although it is difficult to reduce the number of defects to zero in the present circumstances, it is possible to reduce the number to substantially zero.

That is, in the crystalline silicon film shown in FIG. 21B, defects in the crystal grain are reduced to the degree that the defects can be almost neglected, and the crystal grain boundary can not become a barrier against movement of carriers due to the high continuity, so that the film can be regarded as single crystal or substantially single crystal.

Like this, in the crystalline silicon films shown in the photographs of FIGS. 21A and 21B, although the crystal grain boundaries have almost equal continuity, there is a large difference in the number of defects in the crystal grains. The reason why the crystalline silicon film according to the present invention shows electrical characteristics much higher than the crystalline silicon film shown in FIG. 21A lies mainly in the difference in the number of defects.

The present inventors consider the following model for a phenomenon occurring in the step shown in FIG. 4D. First, in the state shown in FIG. 21A, the catalytic element (typically nickel) is segregated at the defects (mainly lamination defects) in the crystal grain. That is, it is conceivable that there are many bonds having a form such as Si—Ni—Si.

However, when Ni existing in the defects is removed by carrying out the gettering process of the catalytic element, the bond of Si—Ni is cut. Thus, the remaining bond of silicon immediately forms Si—Si bond and becomes stable. In this way, the defects disappear.

Of course, although it is known that the defects in a crystalline silicon film disappear by thermal annealing at a high temperature, it is presumed that in the present invention, since bonds with nickel are cut and many uncombined bonds are generated, recombination of silicon is more smoothly carried out.

Moreover, at the same time, it is conceivable that surplus silicon atoms produced at the thermal oxidation of the crystalline silicon film move to the defects, and greatly contribute to the generation of Si—Si bond. This concept is known as the reason why defects are few in the crystal grain of the so-called high temperature polysilicon film.

Besides, the present inventors consider a model in which the crystalline silicon film is bonded to its under film by a heat treatment at a temperature (700 to 1100° C.) above the crystallizing temperature and adhesiveness is increased, so that the defects disappear.

There is a difference of nearly 10 times in thermal expansion coefficient between the crystalline silicon film and the silicon oxide film as the under film. Thus, in the state (FIG. 21A) in which the amorphous silicon film is transformed into the crystalline silicon film, a very large stress is applied to the crystalline silicon film when the crystalline silicon film is cooled.

Figure 22A:
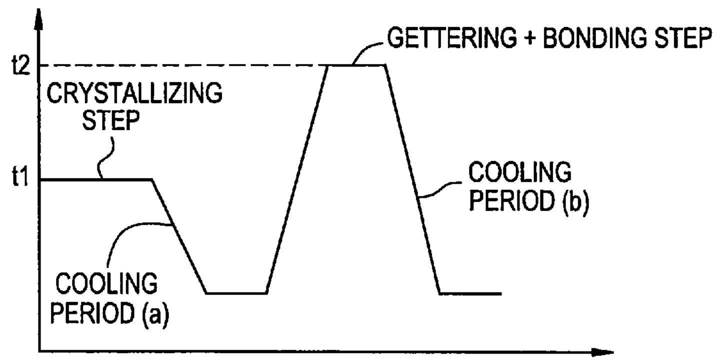
FIGS. 22A to 22C are views for explaining a model with respect to generation and disappearance of defects.

This will be described with reference to FIGS. 22A to 22C. FIG. 22A shows heat hysteresis applied to the crystalline silicon film after the crystallizing step. First, the crystalline silicon film crystallized at a temperature (t1) is cooled to a room temperature through a cooling period (a).

Figure 22B:
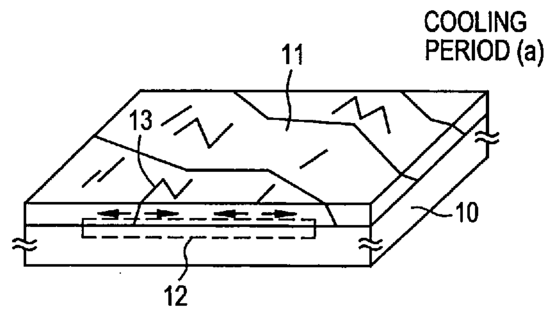
Figure 22C:
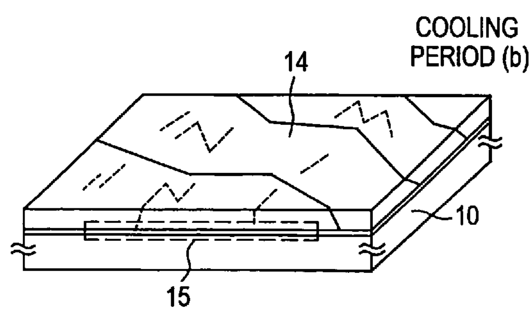

FIG. 22B shows the crystalline silicon film during the cooling period (a), and reference numeral 10 denotes a substrate having an insulating surface, and 11 denotes a crystalline silicon film. At this time, adhesiveness at an interface 12 between the crystalline silicon film 11 and the substrate 10 is not very high, and it is conceivable that this causes production of many defects in grains.

That is, it is conceivable that the crystalline silicon film 11 pulled due to the difference in the thermal expansion coefficient is very easily moved on the substrate 10, so that defects 13 such as lamination defects and dislocations are easily produced by force such as tensile stress.

The thus obtained crystalline silicon film becomes the state as shown in FIG. 21A. Thereafter, as shown in FIG. 22A, the gettering step of the catalytic element is carried out at a temperature (t2), and as the result, the defects in the crystalline silicon film disappear because of the above-described reason.

The important point here is that the crystalline silicon film is bonded to the substrate having the insulating surface at the same time as the gettering step of the catalytic element, so that the adhesiveness to the substrate is raised. That is, it is conceivable that this gettering step also serves as a bonding step of the crystalline silicon film and the substrate (under film).

After the gettering+bonding step is ended in this way, the film is cooled to a room temperature through a cooling period (b). Here, the different point from the cooling period (a) after the crystallizing step is that an interface 15 between the substrate 10 and a crystalline silicon film 14 after annealing becomes a state having very high adhesiveness (FIG. 22C).

When the adhesiveness is high like this, since the crystalline silicon film 14 is completely bonded to the substrate 10, even if stress is applied to the crystalline silicon film at the cooling step of the crystalline silicon film, defects are not produced. That is, it is possible to prevent defects from being produced again.

Incidentally, in FIG. 22A, although the process in which the temperature is lowered to a room temperature after the crystallizing step is exemplified, it is also possible to carry out the gettering+bonding step by directly raising the temperature after the end of crystallization. Even if such a process is carried out, the crystalline silicon film of the present invention can be obtained.

The thus obtained crystalline silicon film (FIG. 21B) of the present invention has a feature that the number of defects in the crystal grains is greatly smaller than the crystalline silicon film (FIG. 21A) in which merely crystallization is carried out.

The difference in the number of defects appears as the difference in spin density by an electron spin resonance analysis (Electron Spin Resonance: ESR). In the present circumstances, it has been ascertained that the spin density of the crystalline silicon film of the present invention is at most $5\times10^{17}$ spins/cm$^3$ or less (preferably $3\times10^{17}$ spins/cm$^3$ or less). However, since this measurement value is near the detection limit of an existing measuring device, it is expected that the actual spin density is lower than this value.

The present applicant refers to the crystalline silicon film having the above described crystal structure and features according to the present invention as a continuous grain boundary crystalline silicon (Continuous Grain Silicon: CGS).

(Findings as to Corresponding Grain Boundary)

The corresponding grain boundary described before is formed only between crystal grains having the same plane orientation. That is, since the plane orientation of the semiconductor thin film of the present invention is uniform in orientation substantially {110}, such a corresponding grain boundary can be formed over a wide range. This feature can not be obtained by other polysilicon film having irregular plane orientation.

Figure 24A:
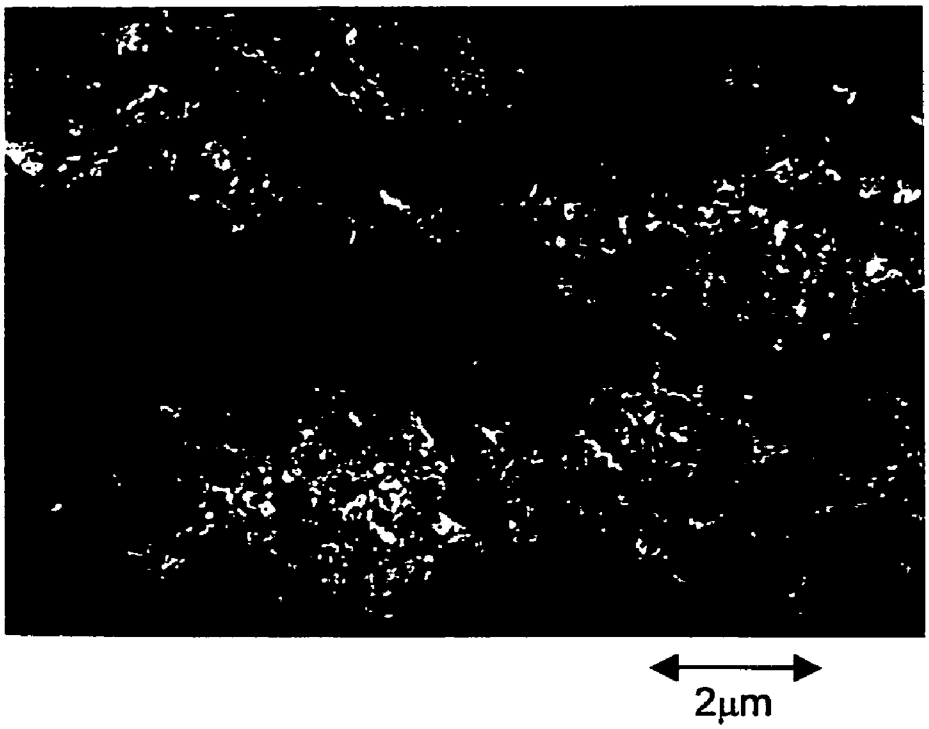
FIGS. 24A and 24B are TEM photographs showing dark field images of semiconductor thin films.

FIG. 24A is a TEM photograph (dark field image) of a semiconductor thin film of the present invention, which is magnified 15 thousands times. Although white regions and black regions are seen in the photograph, it is shown that portions of the same color have the same orientation.

The remarkable feature in FIG. 24A is that in the dark field image of such a wide range, the white regions are continuously clustered at a rather high rate. This means that crystal grains having the same orientation exist with some directionality, and adjacent crystal grains have almost the same orientation.

Figure 24B:
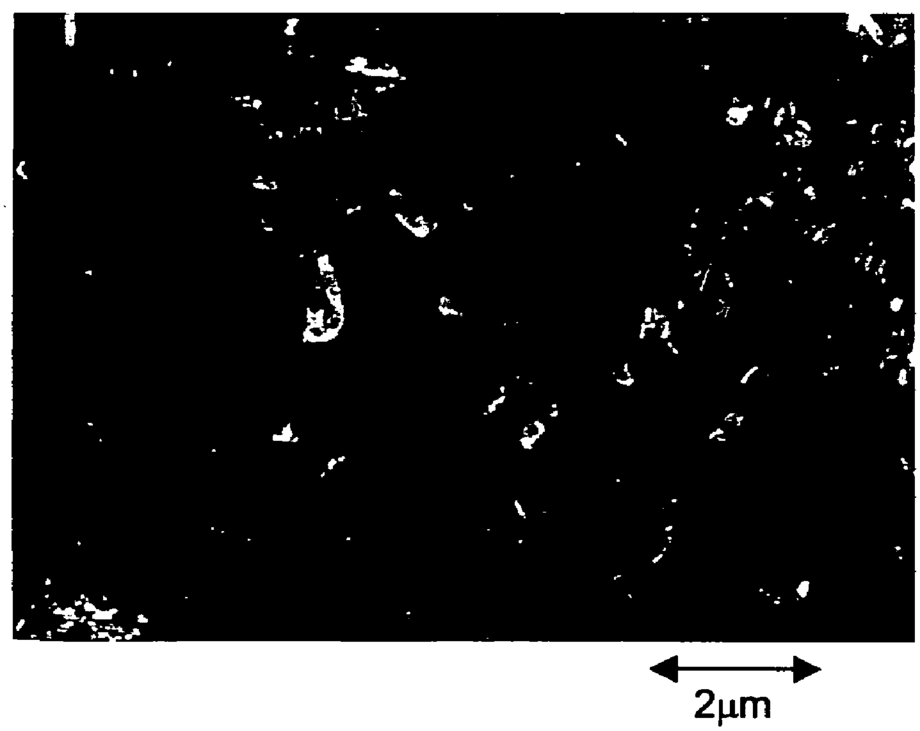

On the other hand, FIG. 24B is a TEM photograph (dark field image) in which a conventional high temperature polysilicon film is magnified 15 thousands times. In the conventional high temperature polysilicon film, portions of the same plane orientation merely exist at random, and the uniformity with directionality as shown in FIG. 24A can not be confirmed. It is conceivable that this is caused from complete irregularity of orientation of adjacent crystal grains.

By repeating observations and measurements over a number of regions other than the measured points shown here, the present applicant has confirmed that the continuity of the crystal lattices at the crystal grain boundary is maintained in a sufficiently wide region for manufacturing a TFT. From these results of observation, it was confirmed that continuity of the crystal lattice in an arbitrary crystal grain boundary was maintained, and a planar grain boundary was formed.

EMBODIMENT 2

In the embodiment 1, although the thermal oxidation film formed on the quartz substrate 100 is used as the under film of the semiconductor thin film, it is also possible to use a thermal oxidation film obtained by thermal oxidation of a surface of a silicon substrate. Also in this case, it is preferable that the thermal oxidation step of the surface of the silicon substrate is carried out in an atmosphere containing halogen such as chlorine since a denser oxide film can be obtained.

When the surface of the silicon substrate is subjected to thermal oxidation and the flattening process such as CMP is applied to the thermal oxidation film, it is possible to obtain an under insulating film having a root-mean-square surface roughness Rms of 0.3 nm or less, and a recess with a depth of 10 nm or less. Moreover, in this under insulating film, it is possible to make the number of recesses per unit area 100 pieces/cm$^2$ or less, and the distance between adjacent recesses 0.3 μm or more.

EMBODIMENT 3

In the embodiment 1, although the thermal oxidation film formed on the quartz substrate 100 is used as the under film of the semiconductor thin film, in this embodiment, a deposition film formed by a CVD method or the like is used. This embodiment will be described with reference to FIGS. 10A to 10C.

Figure 10A:
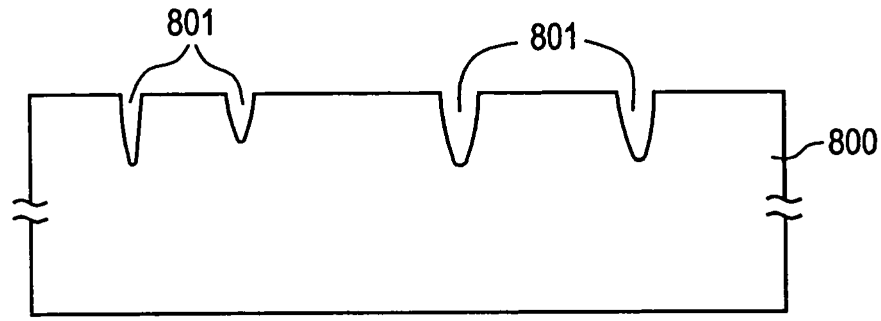
FIGS. 10A to 10C are views showing manufacturing steps of an under film of embodiment 3.

As shown in FIG. 10A, an inexpensive low grade quartz substrate 800 is prepared. Although the surface of the quartz substrate 800 is almost flat, there are irregularly recesses 801 caved at a sharp angle.

Figure 10B:
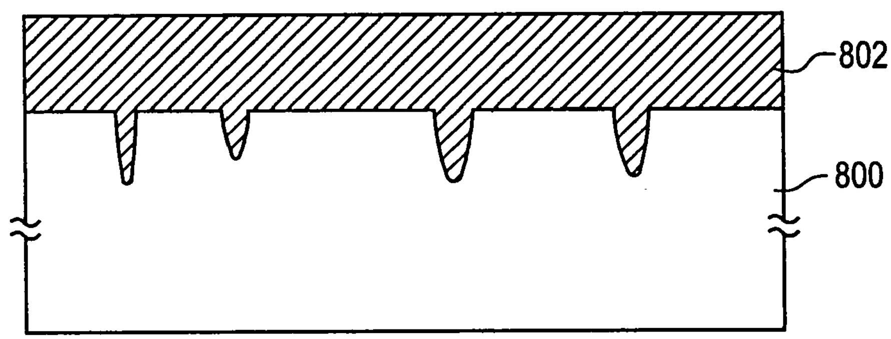

As shown in FIG. 10B, a deposition film 802 made of silicon oxide, silicon nitride, or silicon nitride oxide is formed on the quartz substrate 800 by a plasma CVD method or a sputtering method. Here, a silicon oxide film with a thickness of 500 nm is formed by the plasma CVD method. There are recesses on the surface of the deposition film 802 due to the recesses 801.

Figure 10C:
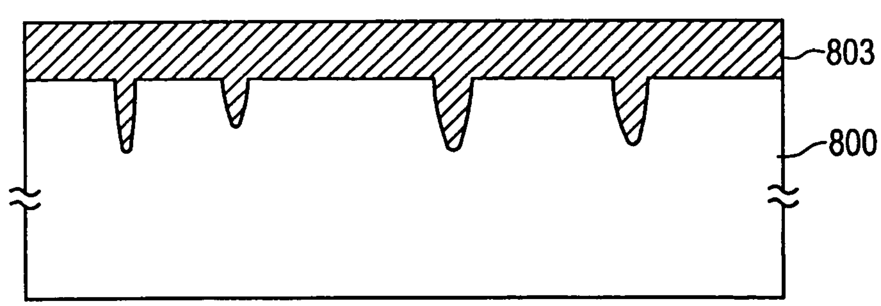

Next, as shown in FIG. 10C, the deposition film 802 is flattened by mechanical polishing, chemical mechanical polishing (CMP), ELID (Electrolytic In-Process Dressing), or the like. The mechanical polishing, chemical mechanical polishing (CMP), ELID (Electrolytic In-Process Dressing), or the like may be used as means for flattening. Annealing is carried out after the flattening step so that the crystallinity of an under film 803 damaged by the polishing step is improved.

In this embodiment, the surface layer of the deposition film 802 is polished and removed by the CMP by a thickness of about 300 nm. The remaining deposition film 802 is the under film 803. By the flattening, it is possible to make such a state that the interval between the recesses on the under film 803 is 0.3 μm or more, and the depth thereof is 10 nm or less.

Moreover, the root-mean-square surface roughness Rms of the under film 803 can be made 0.3 nm or less, and the number of the recesses per unit area can be made 100 pieces/$cm^2$ or less.

Then, in accordance with the method described in the embodiment 1, a crystallized silicon thin film is formed on the under film 803 having the smooth surface. Since the under film 803 is made smooth, it is possible to obtain a semiconductor thin film which can be almost regarded as single crystal described in the embodiment 1.

EMBODIMENT 4

In the embodiments 1 and 3, explanation has been made to the method in which an insulating film is formed on a quartz substrate, and recesses on the surface of the substrate are absorbed to obtain a smooth insulating surface. In this embodiment, a case of polishing the surface of a quartz substrate will be described.

First, a quartz substrate is prepared. Next, the surface layer of the quartz substrate is polished by a means such as CMP (Chemical Mechanical Polish) to flatten the surface. After the flattening step is ended, the quartz substrate is annealed to improve the crystallinity.

As a result, the recess becomes shallow, the root-mean-square surface roughness Rms of the quartz substrate can be made 0.5 nm or less, further, 0.3 nm or less, and the maximum vertical difference P–V can be made 10 nm or less, about 5 to 3 nm. There is a portion where the recess observed in FIG. 20A is not observed in the range of 10×10 $\mu m^2$, the distance L between adjacent recesses can be made 0.3 μm or more, and the number of the recesses can be made 10000 pieces/$cm^2$ or less, further, 100 pieces/$cm^2$.

As described above, even the inexpensive quartz substrate can be used as an insulating substrate having excellent flatness by polishing. When the quartz substrate is used, the under film becomes very dense, so that the stability of an interface between the under film and semiconductor thin film is high. Moreover, since there is scarcely any influence of pollution from the substrate, the usefulness is very high.

Besides, when an insulating under film is formed on this flattened and smoothed quartz substrate by the method described in the embodiments 1 and 3, it becomes possible to obtain the surface with superior flatness.

EMBODIMENT 5

In the embodiment 1, there has been shown an example in which the halogen element is used in the step of gettering the catalytic element for promoting crystallization of silicon. In the present invention, it is also possible to use a phosphorus element in the gettering step of the catalytic element.

First, in accordance with the method described in the embodiment 1, the structure shown in FIG. 4B is obtained. Next, as shown in FIG. 11A, after the mask 111 is removed, a resist mask 150 covering at least a region which becomes an active layer is formed.

Figure 11A:
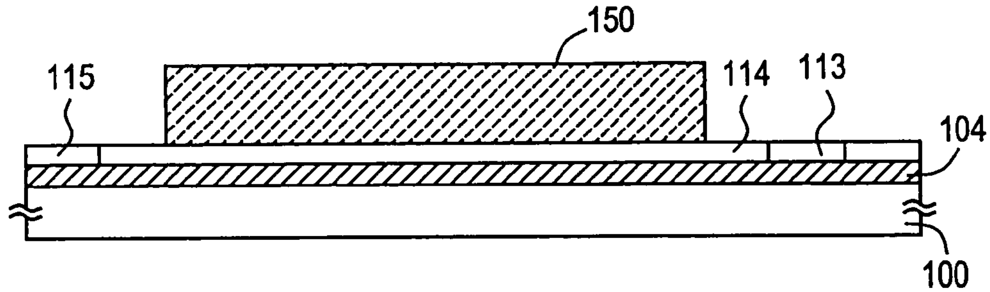
FIGS. 11A to 11D are explanatory views of a phosphorus gettering step of embodiment 5.
Figure 11B:
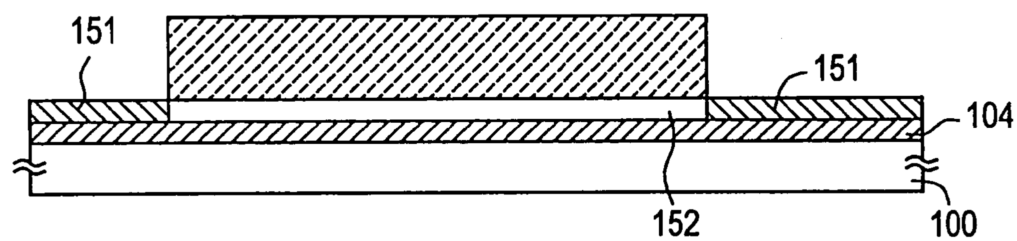
Figure 11C:
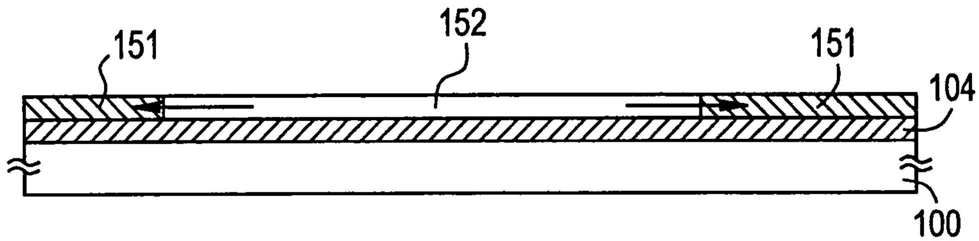
Figure 11D:
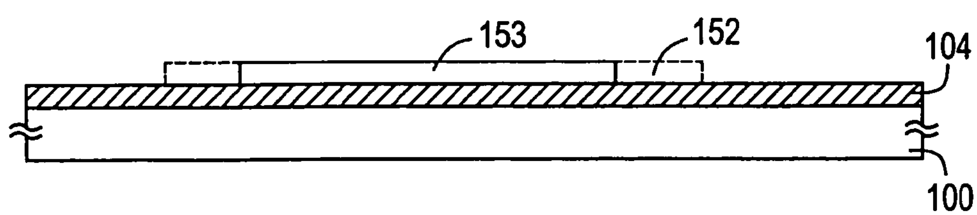

As shown in FIG. 11A, by using the resist mask 150, phosphorus is added into regions other than the region that becomes an active layer, so that a gettering region 151 is formed. As the adding method, a vapor phase method such as an ion doping method, a liquid phase method such as a spin coating method, a sputtering method of a film containing phosphorus, and a solid phase method using formation by a CVD method may be used. The lateral growth region 114 where phosphorus has not been added will be referred to as a gettered region 152.

As shown in FIG. 11A, after the resist mask 150 is removed, it is appropriate that a heat treatment is carried out at a temperature of 400 to 1050° C. (preferably 600 to 750° C.) for 1 min to 20 hr (typically 30 min to 3 hr). The catalytic element is gettered by this heat treatment into the region added with phosphorus, so that the concentration of the catalytic element in the gettered region 152 is reduced down to $5\times10^{17}$ atoms/$cm^3$ or less.

After the gettering step is ended in this way, the gettered region 152 is patterned to form an active layer 153. Subsequently, if the steps in the embodiment 1 are carried out, a semiconductor device having the same feature as the embodiment 1 can be obtained.

Of course, if a heat treatment is carried out in an atmosphere containing a halogen element at the formation of a thermal oxidation film which becomes a gate insulating film, the synergistic effect of the gettering effect due to the phosphorus element in this embodiment and the gettering effect due to the halogen element can be obtained.

EMBODIMENT 6

Figure 12:
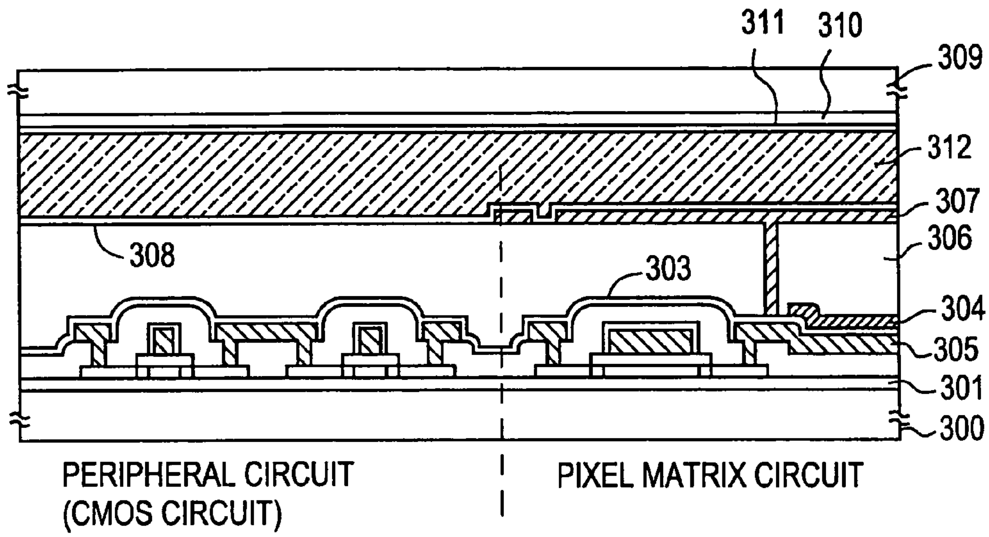
FIG. 12 is a view showing a section of an active matrix substrate of embodiment 6.

In this embodiment, an example in which a reflection type liquid crystal panel is constituted by using a semiconductor device shown in the embodiment 1 will be described. FIG. 12 is a sectional view showing an active matrix type liquid crystal panel, which shows a CMOS circuit in a region where a driver circuit or a logic circuit is constituted, and a pixel TFT in a region where a pixel matrix circuit is constituted. The driver circuit, logic circuit, and pixel matrix circuit are manufactured on an under film 301 formed on a quartz substrate 300. The under film 301 is manufactured by the method described in the embodiments 1 to 4.

The CMOS circuit is fabricated by complementarily combining an N-channel TFT and a P-channel TFT. Since the structure and manufacturing method of the respective TFTs constituting the CMOS circuit have been described in the embodiment 1, the explanation will be omitted.

In the pixel TFT, it is necessary to further make contrivance to a TFT constituting the driver circuit and the like. In FIG. 12, reference numeral 303 denotes a silicon nitride film, which serves also as a passivation film of the CMOS circuit, and at the same time, which functions as an insulator constituting auxiliary capacitance.

A titanium film 304 is formed on the silicon nitride film 303, and the auxiliary capacitance is formed between the titanium film 304 and a drain electrode 305. At this time, since the insulator is the silicon nitride film 303 having high relative dielectric constant, the capacitance can be made large. Since it is not necessary to pay consideration to an opening rate in the reflection type, there is no problem even if the structure as shown in FIG. 12 is made.

Next, reference numeral 306 denotes an interlayer insulating film made of an organic resin film, and acryl is used in this embodiment. It is preferable to make the film thickness of the interlayer insulating film as thick as about 2 μm and to secure sufficient flatness. By doing so, it is possible to form a pixel electrode 307 having excellent flatness.

A pixel electrode 307 is made of aluminum or a material containing aluminum as the main ingredient. It is preferable to use a material having reflectivity as high as possible. When excellent flatness is secured, it is possible to decrease loss by diffused reflection on the surface of the pixel electrode.

An oriented film 308 is formed on the pixel electrode 307. A groove is formed in the oriented film 308 by rubbing. The above is the explanation as to the structure of the TFT side substrate (active matrix substrate).

On the other hand, an opposite side substrate is constructed by forming a transparent conductive film 310 and an oriented film 311 on a transparent substrate 309. Other than those, a black mask or a color filter may be provided as the need rises.

After spacers are distributed and sealing materials are printed, a liquid crystal layer 312 is included so that a reflection type liquid crystal panel with a structure as shown in FIG. 12 is completed. The liquid crystal layer 312 can be freely selected by an operation mode (ECB mode, guest and host mode, etc.) of liquid crystal.

Figure 13:
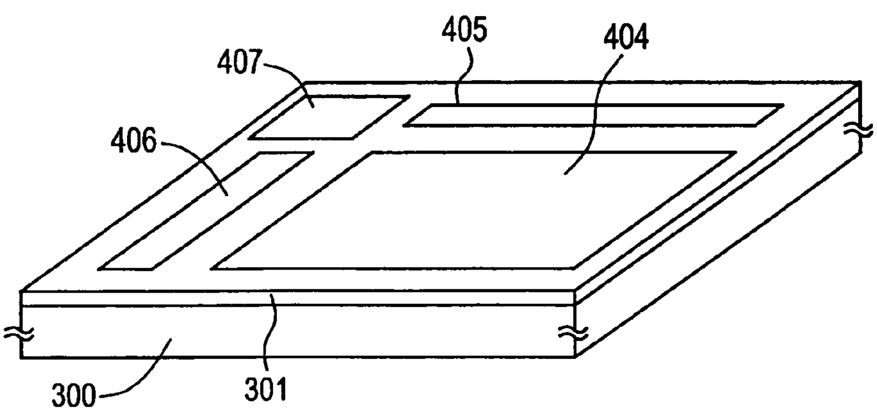
FIG. 13 is a view showing an outer appearance of the active matrix substrate of embodiment 6.

FIG. 13 schematically shows the outer appearance of the active matrix substrate constituting the reflection type liquid crystal panel as shown in FIG. 12. In FIG. 13, reference numeral 300 denotes a quartz substrate, and in accordance with the steps of the embodiment 1, an under film 301 made of a thermal oxidation film is formed on the quartz substrate 300. A pixel matrix circuit 404, a source driver circuit 405, a gate driver circuit 406, and a logic circuit 407 are arranged on the under film 301.

Although the logic circuit 407 contains all logical circuits constituted by TFTs in a wide sense, in order to distinguish it from circuits conventionally called a pixel matrix circuit and a driver circuit, the logic circuit in this specification means a signal processing circuit (memory, D/A converter, clock generator, etc.) other than those.

An FPC (Flexible Print Circuit) terminal as an external terminal is attached to the thus formed liquid crystal panel. In general, what is called a liquid crystal module is a liquid crystal panel in the state in which the FPC is attached thereto.

EMBODIMENT 7

Figure 14:
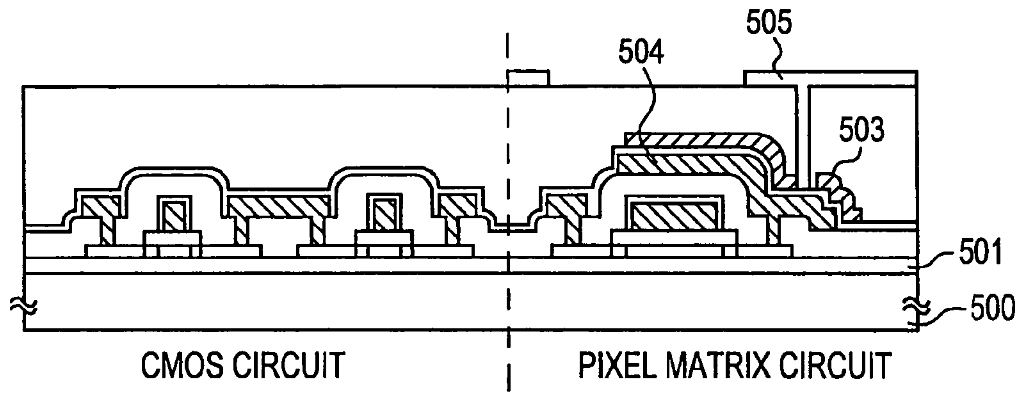
FIG. 14 is a view showing a section of an active matrix substrate of embodiment 7.

In this embodiment, an example in which a transmission type liquid crystal panel is constructed by using a semiconductor device shown in the embodiment 1, will be shown in FIG. 14. The transmission type panel is manufactured on a substrate 500 on which an under film 501 explained in the embodiment 1 or 3 is formed. Since the basic structure of the panel is the same as the reflection type liquid crystal panel shown in the embodiment 4, differences in structure will be especially described.

In the case of the transmission type liquid crystal panel shown in FIG. 14, the structure of a black mask 503 is greatly different from the reflection type liquid crystal panel. That is, since an opening rate must be secured in the transmission type, it is important to make such a structure that the black mask 503 does not overlap, to the utmost, at a portion other than a TFT portion and a wiring portion.

Thus, a drain electrode 504 is formed to overlap with the TFT portion, and auxiliary capacitance is formed between the electrode and a black mask 505. In this way, it is possible to widen the opening rate by forming the auxiliary capacitance, which is apt to occupy a wide area, over the TFT.

Reference numeral 505 denotes a transparent conductive film which becomes a pixel electrode. Although ITO is most frequently used for the transparent conductive film 505, other materials (tin oxide based material, etc.) may be used.

EMBODIMENT 8

In this embodiment, the present invention is applied to a so-called silicon gate TFT in which a conductive silicon film is used as a gate electrode. A panel in this embodiment is manufactured on a substrate 600 on which an under film 601 explained in the embodiment 1 or 3 is formed. Since the basic structure is almost the same as the TFT manufactured in the embodiment 1, explanation will be made while paying attention to only the differences.

Figure 15:
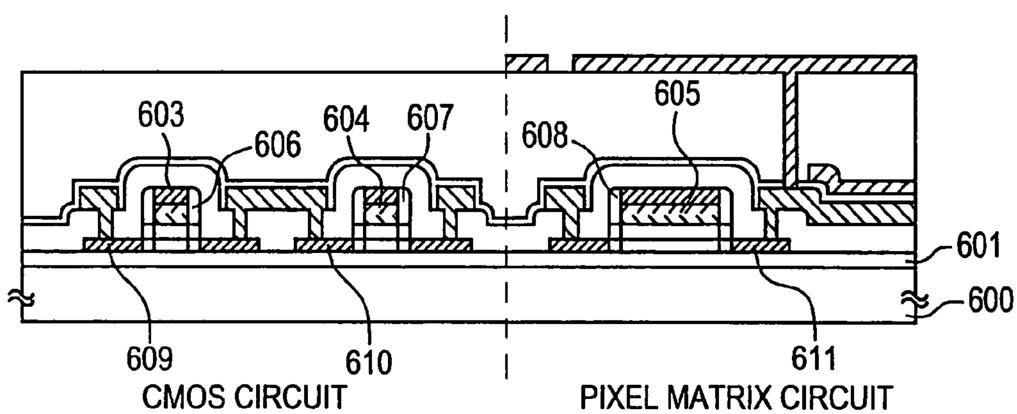
FIG. 15 is a view showing a section of an active matrix substrate of embodiment 8.

In FIG. 15, reference numeral 603 denotes a gate electrode of an N-channel TFT, 604 denotes a gate electrode of a P-channel TFT, and 605 denotes a gate electrode of a pixel TFT. An N-type polysilicon film added with phosphorus or arsenic, or a P-type polysilicon film added with boron or indium is used for gate electrodes 603 to 605.

In the CMOS circuit, a dual gate type CMOS circuit in which an N-type polysilicon gate is used for an N-channel TFT and a P-type polysilicon gate is used for a P channel TFT may be constituted.

Like this, as merits of using the silicon film for the gate electrode, there are enumerated such features that the heat resistance is high, and handling is easy because of the silicon film. A salicide structure (including polycide structure as well) can be adopted by using reaction with a metallic film.

For that purpose, side walls 606 to 608 are formed after the gate electrodes 603 to 605 are formed, metallic films (not shown) of titanium, tungsten or the like are formed, and a heat treatment is carried out to form metal silicide 609 to 611. The metal silicides 609 to 611 are formed in source/drain regions and part of the gate electrodes.

Like this, the structure in which metal silicide is formed in a self-aligning manner by using a side wall or the like is called a salicide structure. When such a structure is adopted, since the ohmic contact to a leading electrode (source/drain electrodes, etc.) becomes excellent, it is effective.

EMBODIMENT 9

Since the TFT of the present invention uses a semiconductor thin film, which can be substantially regarded as single crystal, as an active layer, the TFT shows electrical characteristics comparable to a MOSFET using single crystal. Data as set forth below are obtained from TFTs experimentally formed by the present inventors.

(1) The subthreshold coefficient as an index showing switching performance (promptness in switching of on/off operation) of a TFT is as small as 60 to 100 mV/decade (typically 60 to 85 mV/decade) for both an N-channel TFT and a P-channel TFT.

(2) The field effect mobility ($\mu_{FE}$) as an index showing an operation speed of a TFT is as large as 200 to 650 $cm^2/Vs$ (typically 250 to 300 $cm^2/Vs$) for an N-channel TFT, and 100 to 300 $cm^2/Vs$ (typically 150 to 200 $cm^2/Vs$) for a P-channel TFT.

(3) The threshold voltage ($V_{th}$) as an index indicating a driving voltage of a TFT is as small as −0.5 to 1.5 V for an N-channel TFT and −1.5 to 0.5 V for a P-channel TFT.

As described above, the TFT obtained in the present invention has extremely superior switching characteristics and high speed operation characteristics. Thus, it becomes possible to constitute an integrated circuit such as an LSI, which is conventionally constituted by MOSFETs, by TFTs.

Further, it becomes also possible to constitute a semiconductor device (semiconductor circuit) of a three-dimensional structure by effectively using the merit of a TFT using a thin film.

Figure 16A:
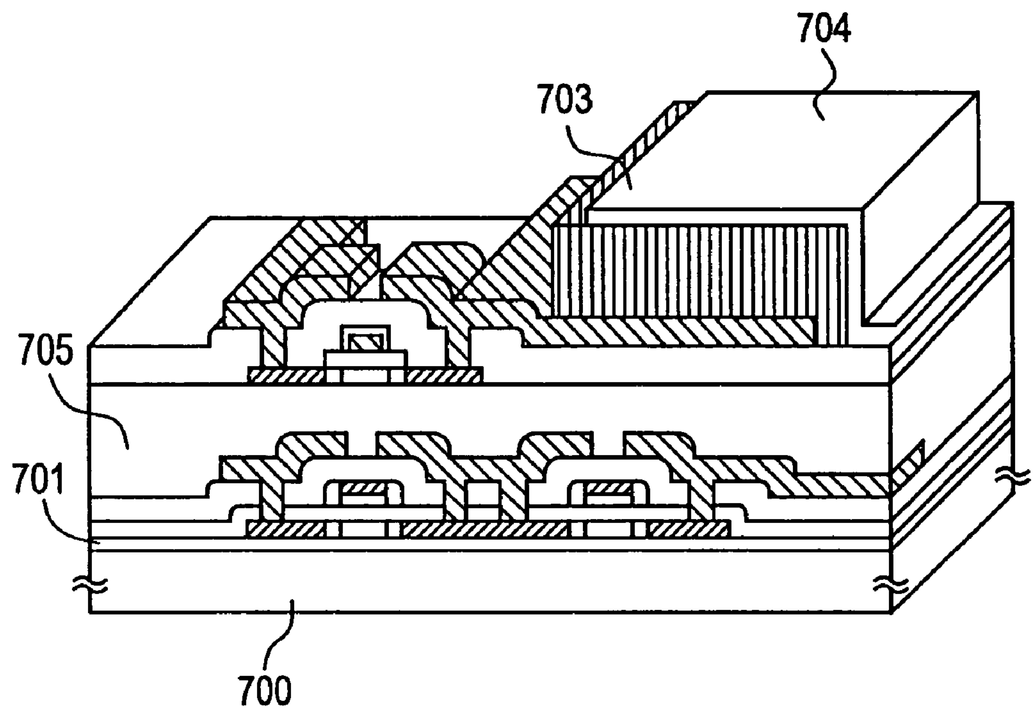
FIGS. 16A and 16B are views showing examples of semiconductor circuits of embodiment 9.
Figure 16B:
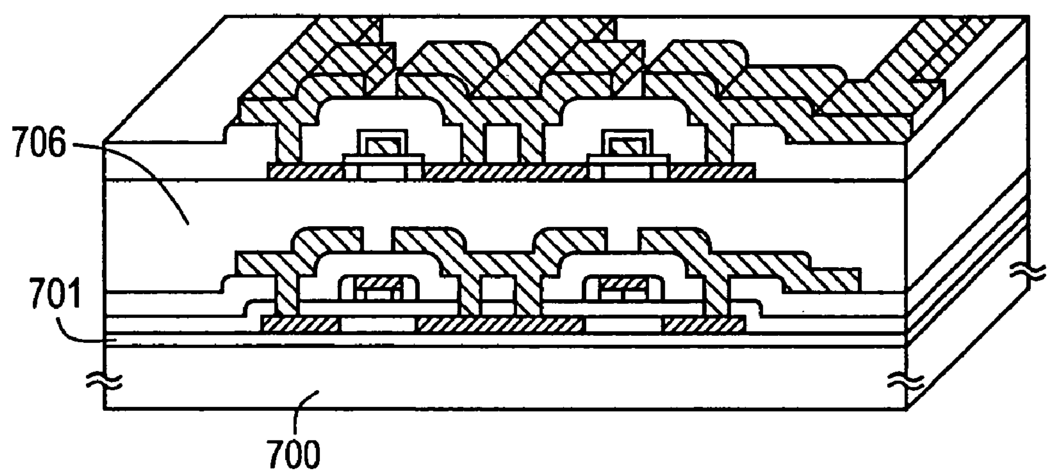

FIGS. 16A and 16B show examples of semiconductor circuits of three-dimensional structure using TFTs of the present invention. FIG. 16A shows a three-dimensional circuit in which a TFT layer at a lower side and an image sensor at an upper side are laminated. FIG. 16B shows a three-dimensional circuit in which TFT layers are laminated at upper and lower layers, and the TFT layer at the lower side is manufactured on a quartz or silicon substrate 700 on which an under film 701 explained in the embodiments 1 to 4 is formed.

In FIG. 16A, reference numeral 703 denotes a photoelectric conversion layer to which an amorphous silicon film or the like may be used. An upper electrode (transparent conductive film) 704 is disposed thereon, which constitutes a light receiving portion receiving light and converting it into an electric signal.

Since the manufacturing steps of the TFT have been described in the embodiment 1, the explanation will be omitted. A well-known means may be used as a laminating technique for constituting the three-dimensional circuit. However, in the case where the upper TFT layer is formed, it is necessary to take the heat resistance of the lower TFT into consideration.

For example, it is also acceptable to adopt such a structure that the lower layer is constituted by a TFT of the present invention and the upper layer is constituted by a conventional TFT formed at a low temperature. Also, the lower layer may be formed of a material with high heat resistance, and the upper layer may be formed of a TFT of the present invention.

Besides, it is also acceptable to adopt such a structure that an image sensor which becomes an upper layer is constituted by only a light receiving portion, and a TFT in a lower layer controls the light receiving portion in the upper layer.

Next, in FIG. 16B, the lower layer is a TFT layer using a silicon gate structure, and the upper layer is a TFT layer with a silicon gate structure or a structure in which other metallic film (film containing aluminum as the main ingredient, etc.) is used as a gate electrode. Also in FIG. 16B, the explanation of the TFT structure will be omitted.

Even in such a structure, it is necessary to manufacture the upper TFT after paying sufficient consideration to the heat resistance of the lower TFT.

Moreover, in both of FIGS. 16A and 16B, it is desirable that interlayer insulating films 705 and 706 with a sufficient thickness are formed after the formation of the TFT in the lower layer, and the films are polished by the CMP (Chemical Mechanical Polishing) or the like to flatten, and then the upper TFT is formed.

As described above, when a semiconductor circuit of a three-dimensional structure is constituted by using the TFT of the present invention, it is possible to constitute a semiconductor circuit having very excellent functionality. Incidentally, in the present specification, the term "semiconductor circuit" is used to mean an electric circuit in which control and conversion of electric signals is carried out by using semiconductor characteristics.

It is also possible to constitute a high frequency circuit (MMIC: Microwave Module IC) or the like for an LCD driver circuit or a portable equipment by using the TFT of the present invention. That is, by using the TFT of the present invention, it is possible to manufacture a conventional IC chip or an LSI chip by using the TFT of the present invention.

EMBODIMENT 10

In the present invention, other than the liquid crystal display device, it is also possible to manufacture other electrooptical devices such as an active matrix type EL (electroluminescence) display device or an EC (electrochromics) display device. It is also possible to manufacture an image sensor or a CCD.

Incidentally, the term "electrooptical device" is used to mean a device for converting an electric signal into an optical signal or a device for performing vice versa.

EMBODIMENT 11

In this embodiment, examples of electronic equipments (applied products) which utilize an electrooptical device using the present invention will be described with reference to FIGS. 17A to 17F. Incidentally, the electronic equipment means a product provided with a semiconductor circuit and/or an electrooptical device.

As the electronic equipments to which the present invention can be applied, a video camera, an electric still camera, a projector, a head mount display, a car navigation system, a personal computer, a portable information terminal (mobile computer, portable telephone, PHS (Personal Handyphone System) etc.) and the like are enumerated.

Figure 17A:
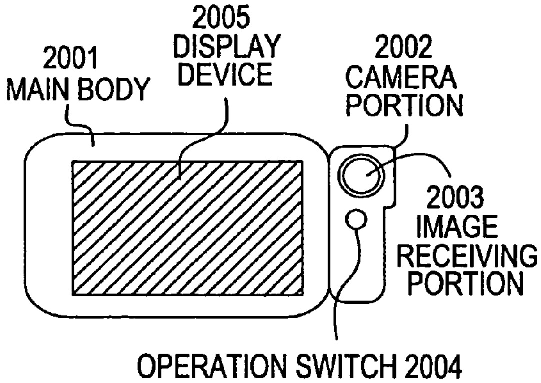
FIGS. 17A to 17F are views showing examples of electronic equipments of embodiment 11.

FIG. 17A shows a mobile computer which is constituted by a main body 2001, a camera portion 2002, an image receiving portion 2003, an operation switch 2004, and a display device 2005. The present invention can be applied to the camera portion 2002, the image receiving portion 2003, the display device 2005, and the like.

Figure 17B:
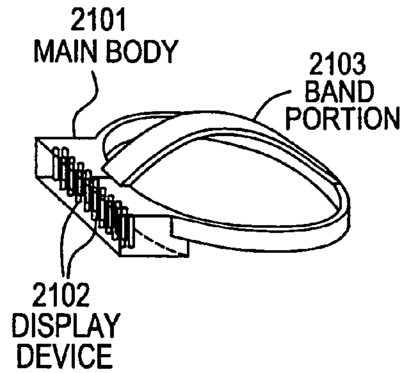

FIG. 17B shows a head mount display which is constituted by a main body 2101, a display device 2102, and a band portion 2103. The present invention can be applied to the display device 2102.

Figure 17C:
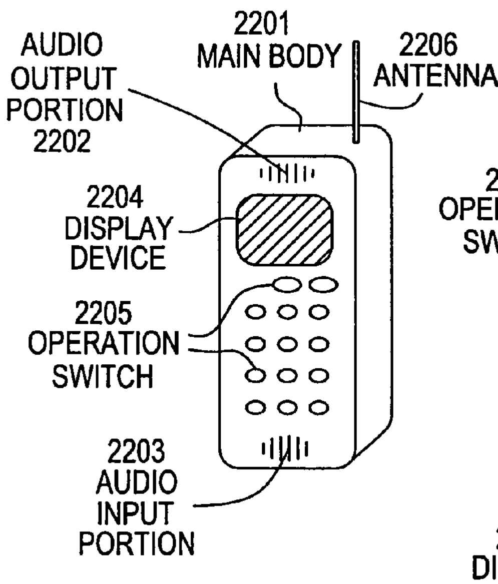

FIG. 17C shows a portable telephone which is constituted by a main body 2201, an audio output portion 2202, an audio input portion 2203, a display device 2204, an operation switch 2205, and an antenna 2206. The present invention can be applied to the audio output portion 2202, the audio input portion 2203, the display device 2204, and the like.

Figure 17D:
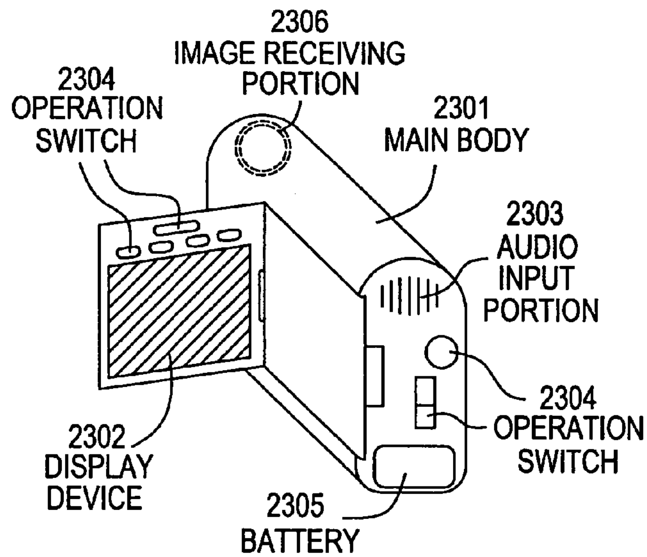

FIG. 17D shows a video camera which is constituted by a main body 2301, a display device 2302, an audio input portion 2303, an operation switch 2304, a battery 2305, and an image receiving portion 2306. The present invention can be applied to the display device 2302, the audio input portion 2303, the image receiving portion 2306, and the like.

Figure 17E:
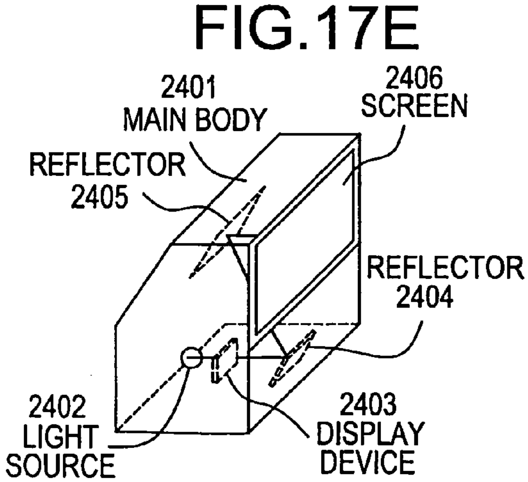

FIG. 17E shows a rear type projector which is constituted by a main body 2401, a light source 2402, a display device 2403, reflectors 2404 and 2405, and a screen 2406. The present invention can be applied to the display device 2403.

Figure 17F:
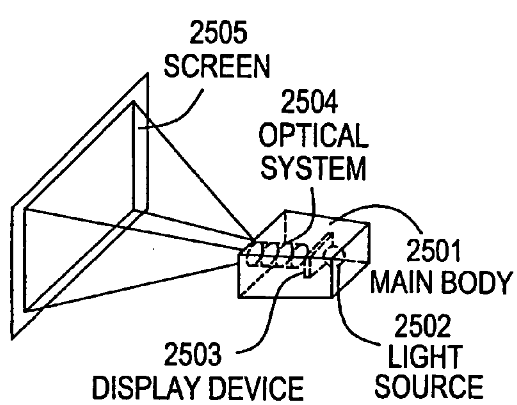

FIG. 17F shows a front type projector which is constituted by a main body 2501, a light source 2502, a display device 2503, an optical system 2504, and a screen 2505. The present invention can be applied to the display device 2503.

As described above, the scope of application of the present invention is very wide, and the present invention can be applied to electronic equipments of any field. Moreover, the present invention can be applied to any product as long as it requires an electrooptical device or a semiconductor circuit.

According to the present invention, it is possible to form a semiconductor thin film having crystallinity which can be substantially regarded as single crystal by forming an amorphous semiconductor thin film on an insulator disclosed in the present specification and by crystallizing the film. By using such a semiconductor thin film, it is possible to realize a TFT having high performance comparable with or superior to a MOSFET manufactured on single crystal.

A semiconductor circuit and an electrooptical device constituted by using TFTs as described above, and an electronic equipment provided with those components have extremely high performance, and becomes an extremely excellent product in functionality, portability, and reliability.

What is claimed is:

1. A method for forming a semiconductor device comprising:

forming an under insulating film over a substrate;

flattening a surface of said under insulating film; and forming a semiconductor film over the flattened surface of said under insulating film, wherein a surface of said under insulating film has recesses for crystal growth, and a distance between adjacent ones of said recesses is not smaller than 0.3 μm.

2. A method according to claim 1 wherein said semiconductor device is incorporated into one selected from the group consisting of a mobile computer, a head mount display, a portable telephone, a camera, a rear type projector and a front type projector.

3. A method according to claim 1 wherein said under insulating film comprises a thermal oxidation film.

4. A method according to claim 1 wherein said semiconductor film comprises a material selected from the group consisting of silicon and $Si_xGe_{1-x}$ where $0<x<1$.

5. A method according to claim 1 further comprising annealing said under insulating film after said flattening.

6. A method according to claim 5 wherein the formation of said semiconductor film is conducted after said annealing.

7. A method according to claim 1 wherein said under insulating film comprises a material selected from the group consisting of silicon oxide, silicon nitride and silicon nitride oxide.

8. A method according to claim 1 wherein said flattening is conducted by mechanical polishing, chemical mechanical polishing or electrolytic in-process dressing.

9. A method for forming a semiconductor device comprising:

flattening a surface of a substrate; and forming a semiconductor film over the flattened surface of said substrate, wherein the flattened surface of said substrate has recesses for crystal growth, and a distance between adjacent ones of said recesses is not smaller than 0.3 μm.

10. A method according to claim 9 wherein said semiconductor device is incorporated into one selected from the group consisting of a mobile computer, a head mount display, a portable telephone, a camera, a rear type projector and a front type projector.

11. A method according to claim 9 wherein said semiconductor film comprises a material selected from the group consisting of silicon and $Si_xGe_{1-x}$ where $0<x<1$.

12. A method according to claim 9 further comprising annealing said substrate after said flattening.

13. A method according to claim 9 wherein said flattening is conducted by chemical mechanical polishing.

14. A method for forming a semiconductor device comprising:

forming an under insulating film over a substrate;

flattening a surface of said under insulating film;

forming a semiconductor film over the flattened surface of said under insulating film; and forming a gate electrode adjacent to said semiconductor film with a gate insulating film therebetween, wherein the flattened surface of said under insulating film has recesses for crystal growth, and a distance between adjacent ones of said recesses is not smaller than 0.3 μm.

15. A method according to claim 14 further comprising annealing said under insulating film after said flattening.

16. A method according to claim 14 further comprising crystallizing said semiconductor film.

17. A method according to claim 14 wherein said gate insulating film comprises a material selected from the group consisting of silicon oxide, silicon nitride and silicon nitride oxide.

18. A method according to claim 14 wherein said gate insulating film comprises a thermal oxidation film.

19. A method according to claim 14 wherein a source region and a drain region are formed in said semiconductor film.

20. A method according to claim 19 wherein a channel region is formed between said source region and said drain region.

21. A method according to claim 14 wherein said semiconductor film comprises a material selected from the group consisting of silicon and $Si_xGe_{1-x}$ where $0<x<1$.

* * * * *